United States Patent
Jang et al.

(10) Patent No.: US 12,022,645 B2
(45) Date of Patent: Jun. 25, 2024

(54) METHODS OF MANUFACTURING SEMICONDUCTOR DEVICE

(71) Applicant: SAMSUNG ELECTRONICS CO., LTD., Suwon-si (KR)

(72) Inventors: Sukhwa Jang, Suwon-si (KR); Kanguk Kim, Seoul (KR); Hyunsuk Noh, Suwon-si (KR); Yeongshin Park, Seoul (KR); Sangkyu Sun, Seoul (KR); Sunyoung Lee, Yongin-si (KR); Sohyang Lee, Seoul (KR); Hongjun Lee, Suwon-si (KR); Hosun Jung, Gimpo-si (KR); Jeongmin Jin, Suwon-si (KR); Jeonghee Choi, Seoul (KR); Jinseo Choi, Hwaseong-si (KR); Cera Hong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 344 days.

(21) Appl. No.: 17/398,136

(22) Filed: Aug. 10, 2021

(65) Prior Publication Data

US 2022/0122986 A1 Apr. 21, 2022

(30) Foreign Application Priority Data

Oct. 20, 2020 (KR) ........................ 10-2020-0136089

(51) Int. Cl.
H10B 12/00 (2023.01)
(52) U.S. Cl.
CPC ....... *H10B 12/0335* (2023.02); *H10B 12/053* (2023.02); *H10B 12/09* (2023.02); *H10B 12/315* (2023.02); *H10B 12/34* (2023.02); *H10B 12/50* (2023.02)

(58) Field of Classification Search
None
See application file for complete search history.

(56) References Cited

U.S. PATENT DOCUMENTS

| | | | |
|---|---|---|---|
| 8,258,056 B2 | 9/2012 | Chang | |
| 9,268,210 B2 | 2/2016 | Hung et al. | |
| 2008/0153299 A1 | 6/2008 | Kim | |
| 2009/0258318 A1 | 10/2009 | Chan | |
| 2011/0171809 A1 | 7/2011 | Scheuerlein et al. | |
| 2016/0041647 A1* | 2/2016 | Bae | G06F 3/0443 |
| | | | 216/13 |
| 2018/0033637 A1 | 2/2018 | Kim et al. | |
| 2019/0043865 A1* | 2/2019 | Chang | H10B 12/488 |

FOREIGN PATENT DOCUMENTS

KR 10-0819673 B1 4/2008

* cited by examiner

*Primary Examiner* — Steven M Christopher
(74) *Attorney, Agent, or Firm* — Fish & Richardson P.C.

(57) ABSTRACT

A method of manufacturing a semiconductor device includes forming a lower structure including a plurality of transistors, forming a conductive layer on the lower structure, forming first preliminary pad mask patterns and wiring mask patterns on the conductive layer, forming pad mask patterns by patterning the first preliminary pad mask patterns while protecting the wiring mask patterns, and etching the conductive layer using the pad mask patterns and the wiring mask patterns as an etching mask to form pad patterns and wiring patterns.

19 Claims, 33 Drawing Sheets

METHODS OF MANUFACTURING SEMICONDUCTOR DEVICE

CROSS-REFERENCE TO RELATED APPLICATION

Korean Patent Application No. 10-2020-0136089 filed on Oct. 20, 2020 in the Korean Intellectual Property Office, and entitled: "Methods of Manufacturing Semiconductor Device," is incorporated by reference herein in its entirety.

BACKGROUND

1. Field

Embodiments relate to a semiconductor device and a method of manufacturing a semiconductor device.

2. Description of the Related Art

Research is being conducted to reduce the size of elements constituting semiconductor devices and to improve performance thereof. For example, in dynamic random-access memory (DRAM) devices, research is being conducted to reliably and stably form elements having a reduced size.

SUMMARY

According to example embodiments, a method of manufacturing a semiconductor device includes forming a lower structure including a plurality of transistors; forming a conductive layer on the lower structure; forming first preliminary pad mask patterns and wiring mask patterns on the conductive layer; forming pad mask patterns by patterning the first preliminary pad mask patterns while protecting the wiring mask patterns; and etching the conductive layer using an etching process using the pad mask patterns and the wiring mask patterns as an etching mask to form pad patterns and wiring patterns.

According to example embodiments, a method of manufacturing a semiconductor device includes forming a lower structure including first transistors and second transistors; forming a conductive layer on the lower structure; forming a first mask layer on the conductive layer; patterning the first mask layer in a patterning process using a first photolithography process using extreme ultraviolet (EUV) light as a light source, to form first preliminary pad mask patterns and wiring mask patterns; forming second preliminary pad mask patterns and a wiring mask protective layer using a multi-patterning technique; etching the first preliminary pad mask patterns using an etching process using the second preliminary pad mask patterns and the wiring mask protective layer as an etching mask, to form pad mask patterns while protecting the wiring mask patterns; and etching the conductive layer using an etching process using the pad mask patterns and the wiring mask patterns as an etching mask, to form pad patterns and wiring patterns. The pad patterns are electrically connected to the first transistors, at least some of the wiring patterns are electrically connected to the second transistors. The multi-patterning technique includes performing, at least once, a second photolithography process using deep ultraviolet (DUV) light having a wavelength longer than a wavelength of extreme ultraviolet (EUV) light, as a light source, and the multi-patterning technique further includes performing a patterning process once or a plurality of times, the pattern process including performing a deposition process and an etching process without a photolithography process.

According to example embodiments, a method of manufacturing a semiconductor device includes forming a conductive layer on a semiconductor substrate, and patterning the conductive layer to form pad patterns and wiring patterns. The patterning the conductive layer includes respectively performing a first patterning process including a first photolithography process using extreme ultraviolet (EUV) light as a light source, and performing a second patterning process including a second photolithography process of using deep ultraviolet (DUV) light having a wavelength longer than a wavelength of the extreme ultraviolet (EUV) light, as a light source. The second patterning process is performed after the first patterning process is performed. The pad patterns are formed after performing both the first patterning process and the second patterning process. The wiring patterns are formed by the first patterning process before performing the second patterning process.

BRIEF DESCRIPTION OF DRAWINGS

Features will become apparent to those of skill in the art by describing in detail exemplary embodiments with reference to the attached drawings, in which.

DETAILED DESCRIPTION

Figure 1A:
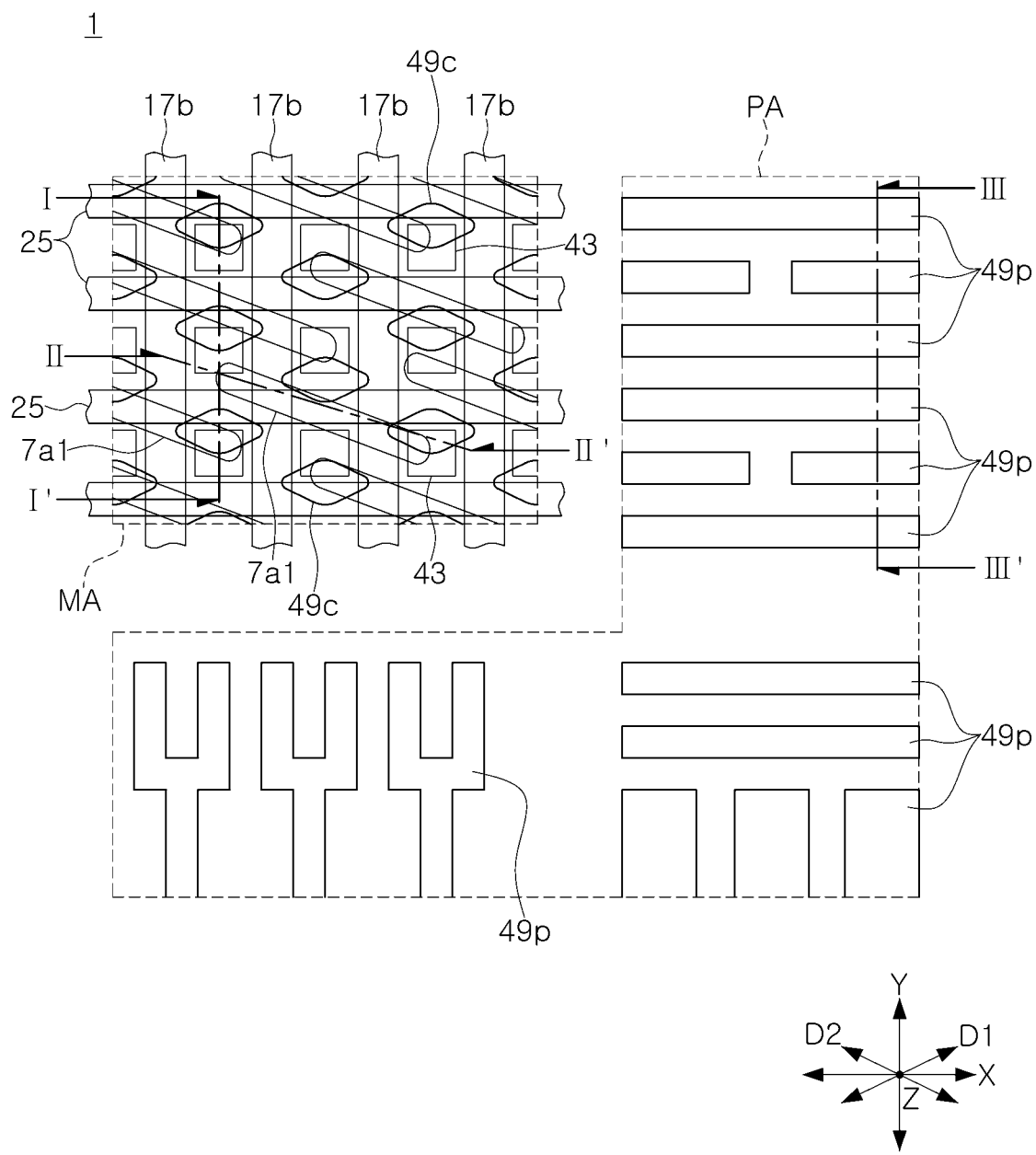
FIG. 1A is a schematic plan view of a semiconductor device according to an example embodiment.
Figure 1B:
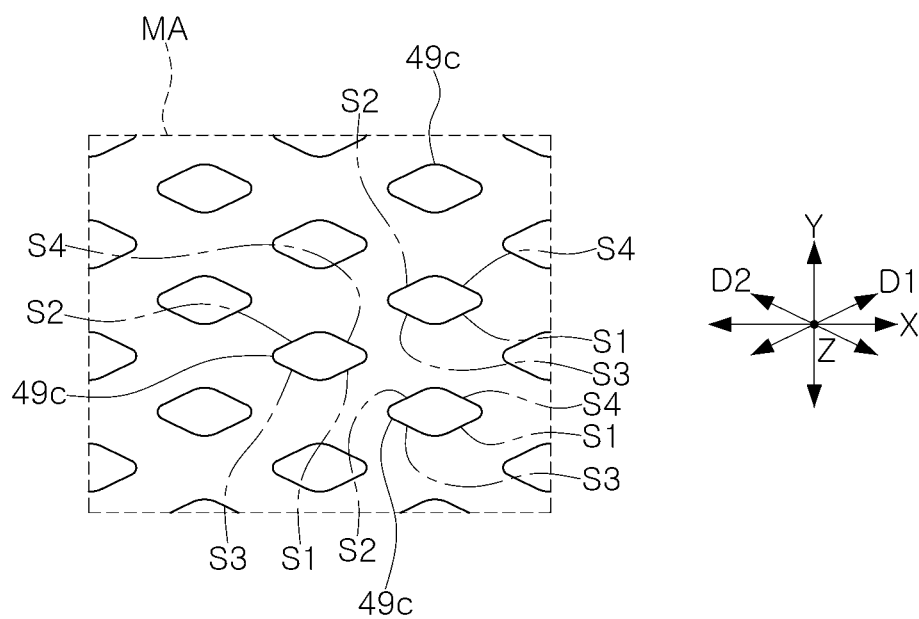
FIG. 1B is a plan view illustrating some components of FIG. 1A.
Figure 2A:
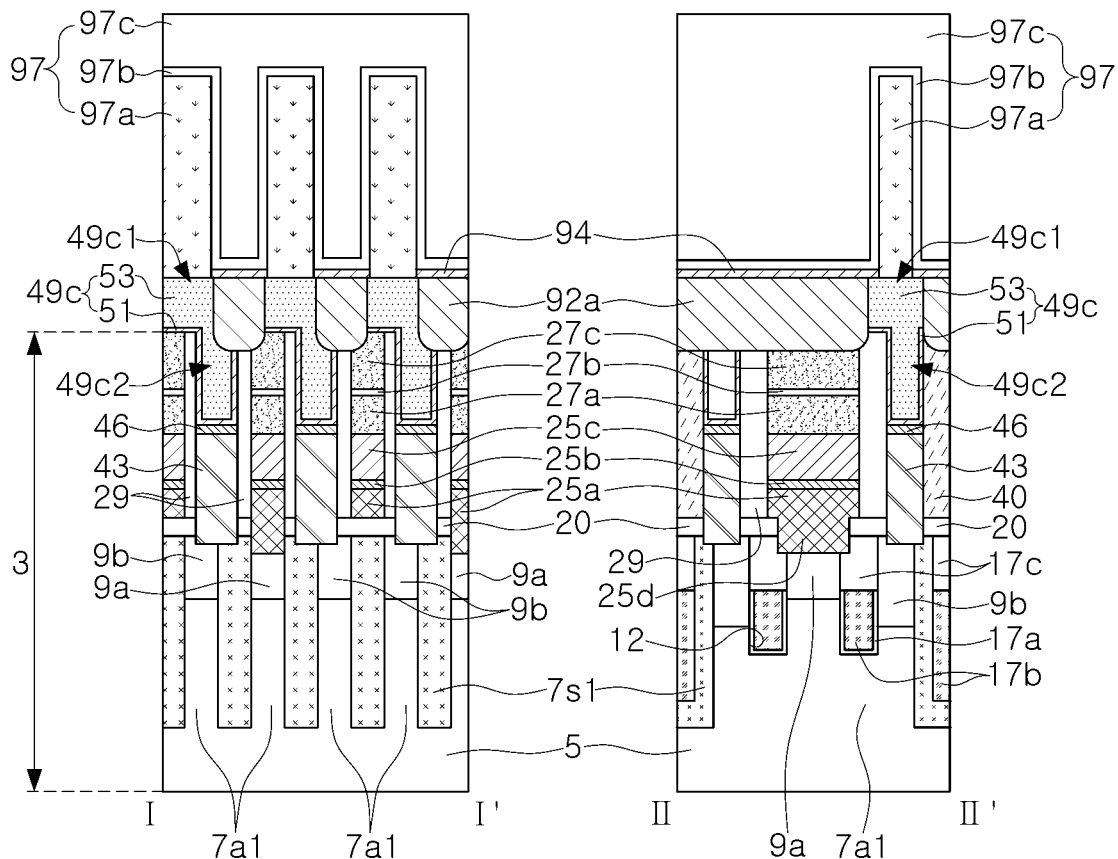
FIG. 2A is a schematic cross-sectional view along lines I-I' and II-II' of FIG. 1A.
Figure 2B:
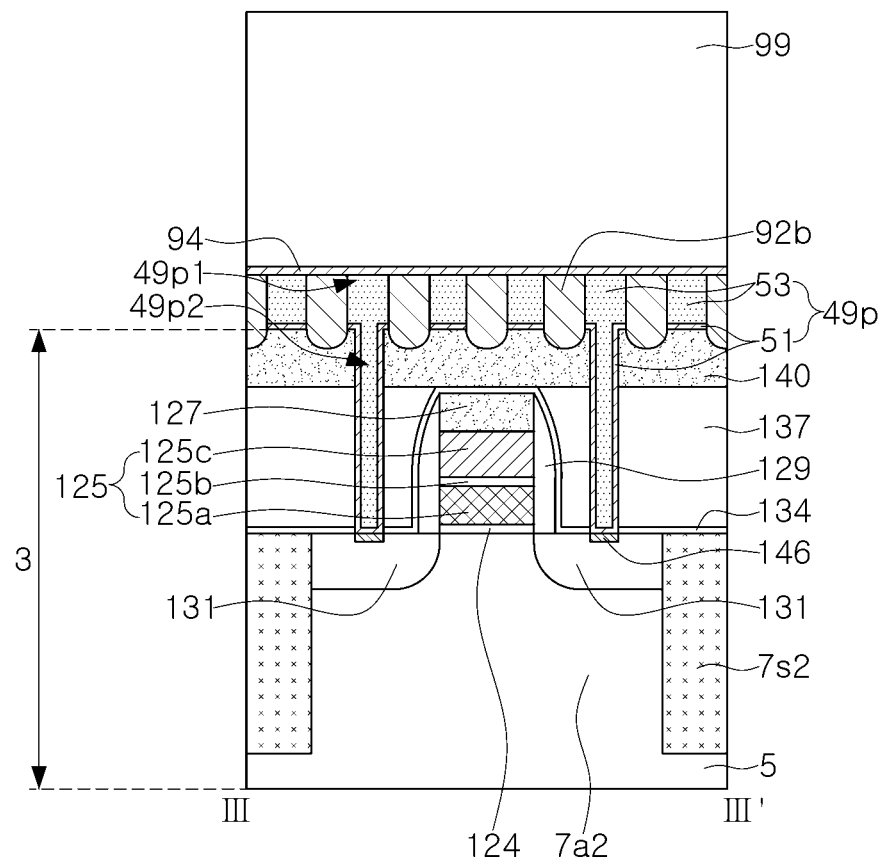
FIG. 2B is a schematic cross-sectional view along line III-III' of FIG. 1A.

FIG. 1A is a plan view schematically illustrating an example of a semiconductor device according to an example embodiment, FIG. 1B is a plan view illustrating pad patterns 49c of FIG. 1A, FIG. 2A is a cross-sectional view along lines I-I' and II-II' of FIG. 1A, and FIG. 2B is a cross-sectional view along line III-III' of FIG. 1A.

Referring to FIGS. 1A, 1B, 2A and 2B, a semiconductor device 1 according to an example embodiment may include a lower structure 3 having a plurality of transistors CTR and PTR, pad patterns 49c and wiring patterns 49p on the lower structure 3, and a data storage structure 97 electrically connected to the pad patterns 49c, on the lower structure 3.

In example embodiments, the lower structure 3 may include a semiconductor substrate 5 having a first area MA and a second area PA, first active regions 7a1 on the semiconductor substrate 5 of the first area MA, second active regions 7a2 on the semiconductor substrate 5 of the second area PA, a first device isolation region 7s1 on side surfaces of the first active regions 7a1, and a second device isolation region 7s2 on side surfaces of the second active regions 7a2.

Hereinafter, for convenience of description, a description will be given centering on one first active region 7a1 and one second active region 7a2. In addition, hereinafter, even in the case in which a description is focused on one component, it may be understood that the one component may be disposed in plural.

In example embodiments, the lower structure 3 may further include one or a plurality of gate trenches 12 crossing the first active region 7a1 and extending to the first device isolation region 7s1, first gate structures 15 disposed in the gate trenches 12, and a first impurity region 9a and a second impurity region 9b disposed in the first active region 7a1 adjacent to side surfaces of the first gate structures 15. Each of the first gate structures 15 may include a first gate electrode 17b, a first gate dielectric 17a between the first gate electrode 17b and the first active region 7a1, and a first gate capping layer 17c on the first gate electrode 17b. The first gate electrode 17b may be formed of a conductive material, and the first gate capping layer 17c may be formed of an insulating material. For example, the first gate electrode 17b may include doped polysilicon, metal, conductive metal nitride, conductive metal silicide, conductive metal oxide, graphene, carbon nanotubes, or combinations thereof. For example, the first gate electrode 17b may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, graphene, carbon nanotubes, or combinations thereof, but the material thereof is not limited thereto. The first gate electrode 17b may include a single layer or multiple layers of the aforementioned materials.

Any one of the first gate structures 15 and the first and second impurity regions 9a and 9b disposed on both sides of the first gate structure 15 may constitute a first transistor CTR. In this case, the first and second impurity regions 9a and 9b may be first source/drain regions.

In example embodiments, the lower structure 3 may further include a second gate structure 123 disposed on the second active region 7a2, a peripheral gate capping layer 127 on the second gate structure 123, and second source/drain regions 131 disposed in the second active region 7a2 on both sides of the second gate structure 123. The second gate structure 123 may include a second gate dielectric 124 and a second gate electrode 125 on the second gate dielectric 124. The second gate electrode 125 may include a first electrode material layer 125a, a second electrode material layer 125b, and a third electrode material layer 125c sequentially stacked. For example, the first electrode material layer 125a may include doped silicon, e.g., polysilicon having N-type conductivity or polysilicon having P-type conductivity, the second electrode material layer 125b may include a metal-semiconductor compound, e.g., tungsten silicide, and the third electrode material layer 125c may include a metal, e.g., tungsten. The second gate electrode 125 and the second source/drain regions 131 may constitute a second transistor PTR. The peripheral gate capping layer 127 may be formed of an insulating material, e.g., silicon nitride.

In example embodiments, the first area MA may be a memory cell area in which memory cells storing information are disposed, and the second area PA may be a peripheral area or a peripheral circuit area disposed in an area adjacent to the first area MA. Hereinafter, the first area MA will be referred to as a memory cell area, and the second area PA will be referred to as a peripheral circuit area in the description below.

In example embodiments, the first active region 7a1 may be a cell active region, and the second active region 7a2 may be a peripheral active region. Hereinafter, the first active region 7a1 will be referred to as a cell active region, and the second active region 7a2 will be referred to as a peripheral active region.

In example embodiments, the first transistor CTR may be a cell transistor or a cell switching device, and the second transistor PTR may be a peripheral transistor or a peripheral circuit transistor. Hereinafter, the first transistor CTR will be referred to as a cell transistor, and the second transistor PTR will be referred to as a peripheral transistor. The first gate electrode 17b of the cell transistor CTR may be a cell gate electrode or a word line, and the second gate electrode 125 of the peripheral transistor PTR may be a peripheral gate electrode.

In example embodiments, the lower structure 3 may further include a buffer insulating layer 20 formed on the cell active region 7a1 and the first device isolation region 7s1.

In example embodiments, the lower structure 3 may further include a bit line structure 23 and a contact plug 43. The bit line structure 23 may include a bit line 25 and a bit line capping layer 27 that are sequentially stacked. The bit line 25 may be formed of a conductive material. The bit line 25 may include a first bit line material layer 25a, a second bit line material layer 25b, and a third bit line material layer 25c sequentially stacked. For example, the first bit line material layer 25a may include doped silicon, e.g., polysilicon having N-type conductivity, the second bit line material layer 25b may include a metal-semiconductor compound, e.g., tungsten silicide, and the third bit line material layer 25c may include a metal, e.g., tungsten. The bit line capping layer 27 may include a first bit line capping layer 27a, a second bit line capping layer 27b, and a third bit line capping layer 27c sequentially stacked. The bit line capping layer 27 may be formed of an insulating material. Each of the first to third bit line capping layers 27a, 27b and 27c may be formed of silicon nitride or a silicon nitride-based insulating material.

In example embodiments, the bit line 25 may further include a bit line contact portion 25d extending downwardly from the first bit line material layer 25a and electrically connected to the first impurity region 9a. The bit line 25 may be formed on the buffer insulating layer 20, and the bit line contact portion 25d of the bit line 25 may penetrate through the buffer insulating layer 20 to contact the first impurity region 9a.

In example embodiments, the contact plug 43 may penetrate through the buffer insulating layer 20 and may contact the second impurity region 9b. The contact plug 43 may include doped silicon, e.g., polysilicon having N-type conductivity.

In example embodiments, the lower structure 3 may further include a bit line spacer 29 that may contact side surfaces of the bit line structure 23 and may be formed of an insulating material, and a peripheral gate spacer 129 that may be in contact with side surfaces of the second gate structure 123 and may be formed of an insulating material.

In example embodiments, the lower structure 3 may further include a partition wall insulating pattern 40 contacting the contact plug 43, between a pair of the bit lines 25 adjacent to and parallel to each other. For example, between a pair of the bit lines 25 that are adjacent and parallel to each other, the contact plug 43 may be disposed in plural, and the partition wall insulating pattern 40 may be disposed between the plurality of contact plugs 43.

In example embodiments, the lower structure 3 may further include an insulating liner 134 covering the peripheral active region 7a2 and the second device isolation region 7s2, and covering the surface of the peripheral gate spacer 129 and the upper surface of the second gate structure 123. The lower structure 3 may further include a first interlayer insulating layer 137 on the insulating liner 134, and a second interlayer insulating layer 140 on the first interlayer insulating layer 137. In an example, a portion of the insulating liner 134 positioned on the upper surface of the second gate structure 123 may contact the second interlayer insulating layer 140. The second gate structure 123 may be a peripheral gate structure.

In example embodiments, the first interlayer insulating layer 137 may be formed of a material different from that of the insulating liner 134 and the second interlayer insulating layer 140. For example, the first interlayer insulating layer 137 may be formed of silicon oxide or a silicon oxide-based insulating material, and the insulating liner 134 and the second interlayer insulating layer 140 may be formed of silicon nitride or a silicon nitride-based insulating material.

The pad patterns 49c may be disposed on the memory cell area MA of the semiconductor substrate 5, and the wiring patterns 49p may be disposed on the peripheral circuit area PA of the semiconductor substrate 5.

The pad patterns 49c and the wiring patterns 49p may be formed of the same conductive material. For example, each of the pad patterns 49c and the wiring patterns 49p may include a first conductive material layer 51, and a second conductive material layer 53 on the first conductive material layer 51. For example, the first conductive material layer 51 may include a metal nitride, e.g., titanium nitride, and the second conductive material layer 53 may include a metal, e.g., tungsten.

In example embodiments, each of the pad patterns 49c may include a pad portion 49c1 on the lower structure 3, and a first plug portion 43c2 extending from the pad portion 49c1 into the lower structure 3 and electrically connected to the contact plug 43. Accordingly, the pad patterns 49c may be electrically connected to the cell transistors CTR through the contact plugs 43.

In example embodiments, at least one of the wiring patterns 49p may include a wiring portion 49p1 on the lower structure 3, and a second plug portion 43p2 extending from the wiring portion 49p1 into the lower structure 3 and electrically connected to the peripheral transistor PTR. Accordingly, at least some of the wiring patterns 49p may be electrically connected to the peripheral transistor PTR.

In example embodiments, the lower structure 3 may further include a first metal-semiconductor compound layer 46 electrically connecting the contact plug 43 and the first plug portion 43c2, between the contact plug 43 and the first plug portion 43c2, and a second metal-semiconductor compound layer 146 electrically connecting the second source/drain regions 131 and the second plug portion 43p2, between the second source/drain region 131 and the second plug portion 43p2.

In example embodiments, as illustrated in FIG. 1A, when viewed in a plan view, the bit lines 25 may have a line shape extending in a first horizontal direction X, and the first gate electrodes 17b, e.g., the word lines, may have a line shape extending in a second horizontal direction Y perpendicular to the first horizontal direction X. As illustrated in FIG. 1B, each of the pad patterns 49c may have a first side S1 and a second side S2 opposing each other and parallel to each other, and a third side S3 and a fourth side S4 opposing each other and parallel to each other. Each of the pad patterns 49c may have the first to fourth sides S1, S2, S3 and S4, and may have a rounded shape in a region in which the first to fourth sides S1, S2, S3 and S4 meet each other. For example, when viewed in a plan view, each of the pad patterns 49c may have edges such as the first to fourth sides S1, S2, S3 and S4, and may have a rounded shape in portions in which the edges S1, S2, S3 and S4 are adjacent to each other. In example embodiments, each of the pad patterns 49c may have an oval shape, a circle shape, or a quadrangular shape in which vertex portions are rounded.

In example embodiments, when viewed in a plan view, in each of the pad patterns 49c, the first and second sides S1 and S2 may have a line shape extending in a first diagonal direction D1 that forms an acute angle with respect to the first horizontal direction X, and the third and fourth sides S3 and S4 may have a line shape extending in a second diagonal direction D2 that forms an obtuse angle with respect to the first horizontal direction X.

In example embodiments, when viewed in a plan view, among the pad patterns 49c, in the pad patterns sequentially arranged in the first diagonal direction D1, the first sides S1 may be aligned in the first diagonal direction D1, and the second sides S2 may be aligned in the first diagonal direction D1. In example embodiments, in a plan view, among the pad patterns 49c, in the pad patterns sequentially arranged in the second diagonal direction D2, the third sides S3 may be aligned in the second diagonal direction D2, and the fourth sides S4 may be aligned in the second diagonal direction D2.

The semiconductor device 1 according to an example embodiment may further include first insulating patterns 92a filling between the pad patterns 49c and second insulating patterns 92b filling between the wiring patterns 49p, on the lower structure 3. The first insulating patterns 92a may fill between the pad portions 49c1 of the pad patterns 49c and extend into the lower structure 3, and the second insulating patterns 92b may fill between the wiring portions 49p1 of the wiring patterns 49p and extend into the lower structure 3. A lower surface of each of the first and second insulating patterns 92a and 92b may be disposed on a lower level than a lower surface of each of the pad portions 49c1 and the wiring portions 49p1, e.g., a distance between a bottom of the semiconductor substrate 5 and the lower surface of each of the first and second insulating patterns 92a and 92b may be smaller than a distance between the bottom of the semiconductor substrate 5 and a corresponding one of the lower surfaces of the pad portions 49c1 and the wiring portions 49p1.

In example embodiments, the data storage structure 97 may be a capacitor that stores information in a DRAM device. For example, the data storage structure 97 may include first electrodes 97a electrically connected to the pad patterns 49c, on the pad patterns 49c, a second electrode 97c covering the first electrodes 97a, and a dielectric layer 97b disposed between the first electrodes 97a and the second electrode 97c. The dielectric layer 97b may be a dielectric layer of a capacitor that stores information in a DRAM device.

In another embodiment, the data storage structure 97 may be a data storage structure capable of storing information in a nonvolatile memory device, e.g., a magnetoresistive random-access memory (MRAM) device or a variable resistance memory device.

The semiconductor device 1 according to an example embodiment may further include an etch stop insulating layer 94 on the first and second insulating patterns 92a and 92b and the wiring patterns 49p.

The semiconductor device 1 according to an example embodiment may further include an upper insulating layer 99 covering the wiring patterns 49p, on the etch stop insulating layer 94 on the second area PA of the semiconductor substrate 5.

Figure 3:
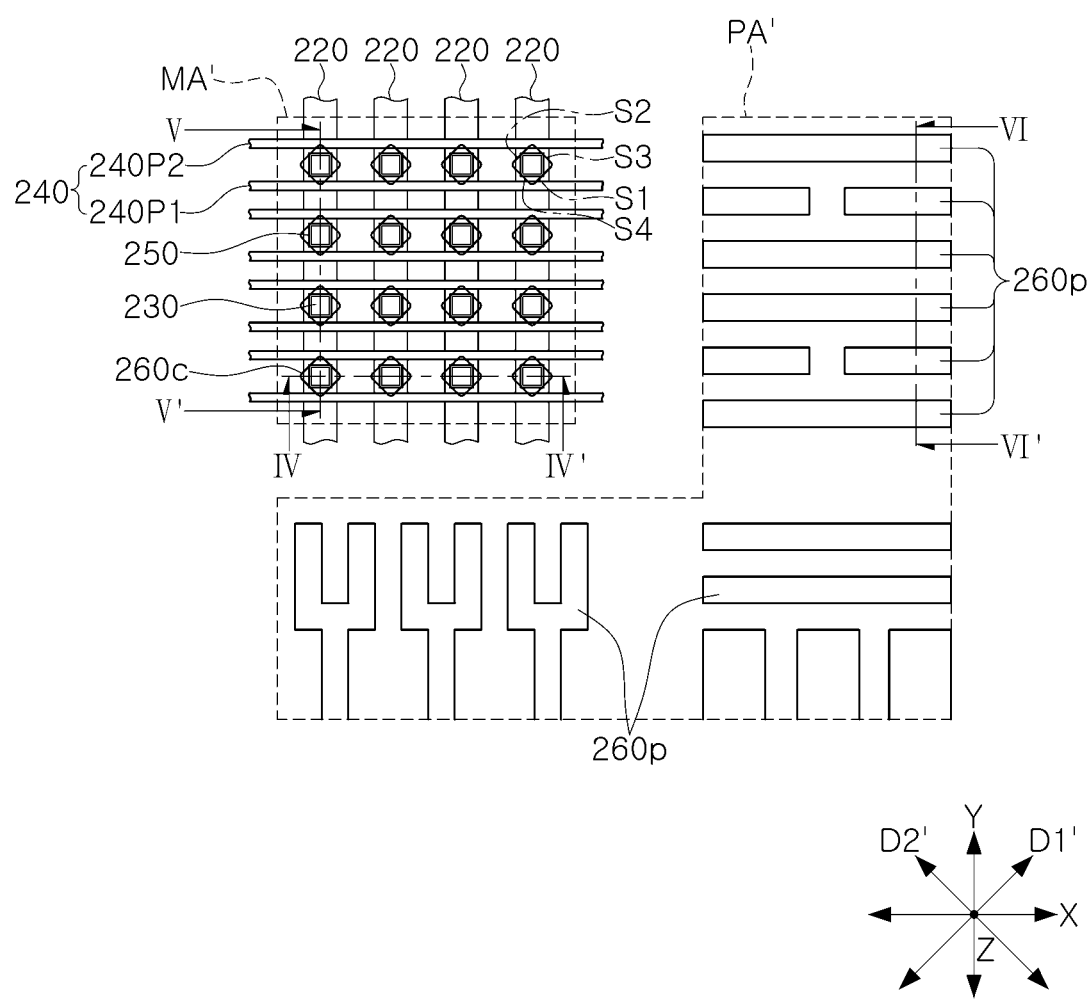
FIG. 3 is a schematic plan view of another example of a semiconductor device according to an example embodiment.
Figure 4A:
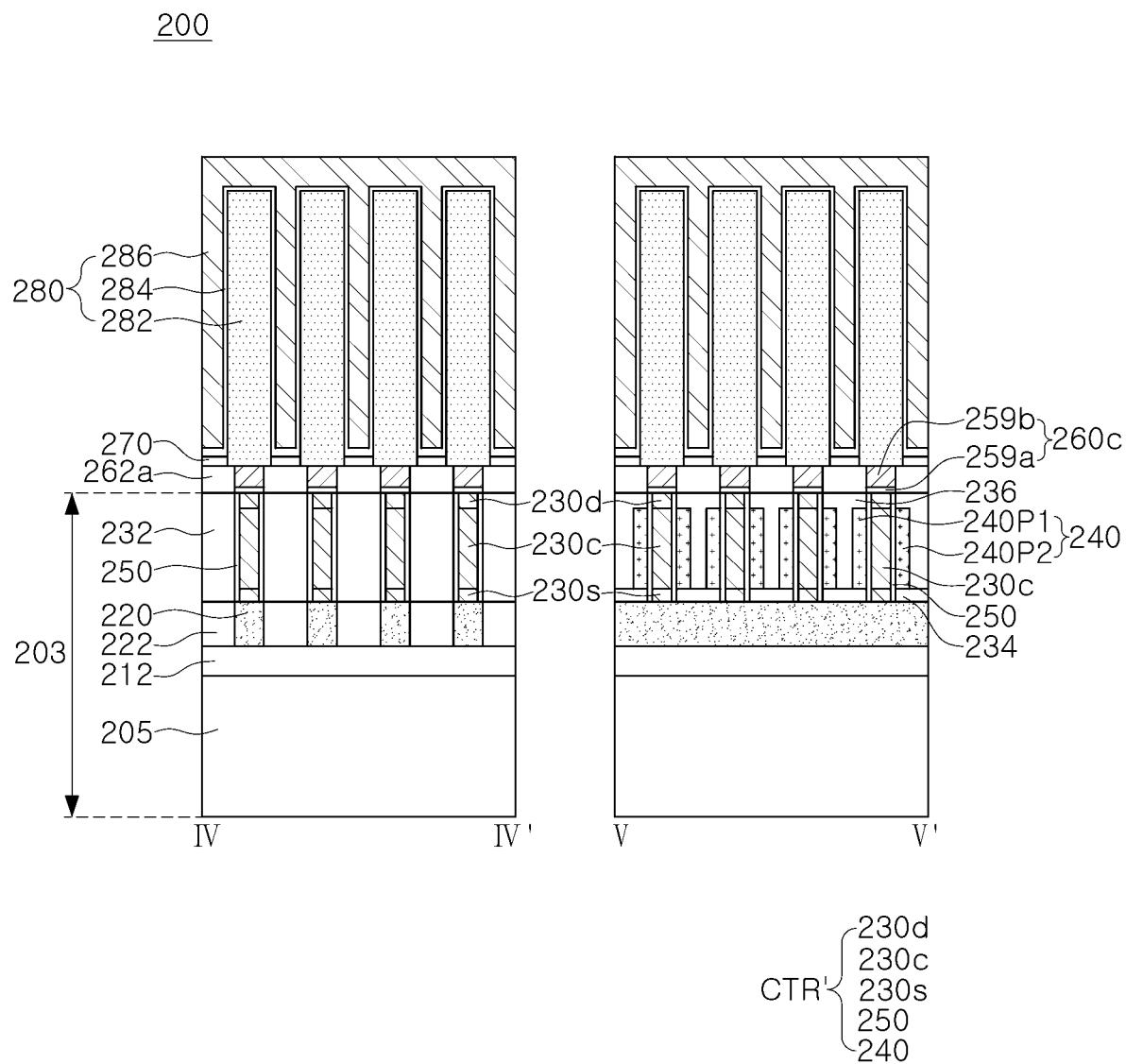
FIG. 4A is a schematic cross-sectional view along lines IV-IV' and V-V' of FIG. 3.

Next, another example of a semiconductor device according to an example embodiment will be described with reference to FIGS. 3, 4A, and 4B. FIG. 3 is a schematic plan view illustrating another example of a semiconductor device according to an example embodiment. FIG. 4A is a cross-sectional view along lines IV-IV' and V-V' of FIG. 3, and FIG. 4B is a cross-sectional view along line VI-VI' of FIG. 3.

Figure 4B:
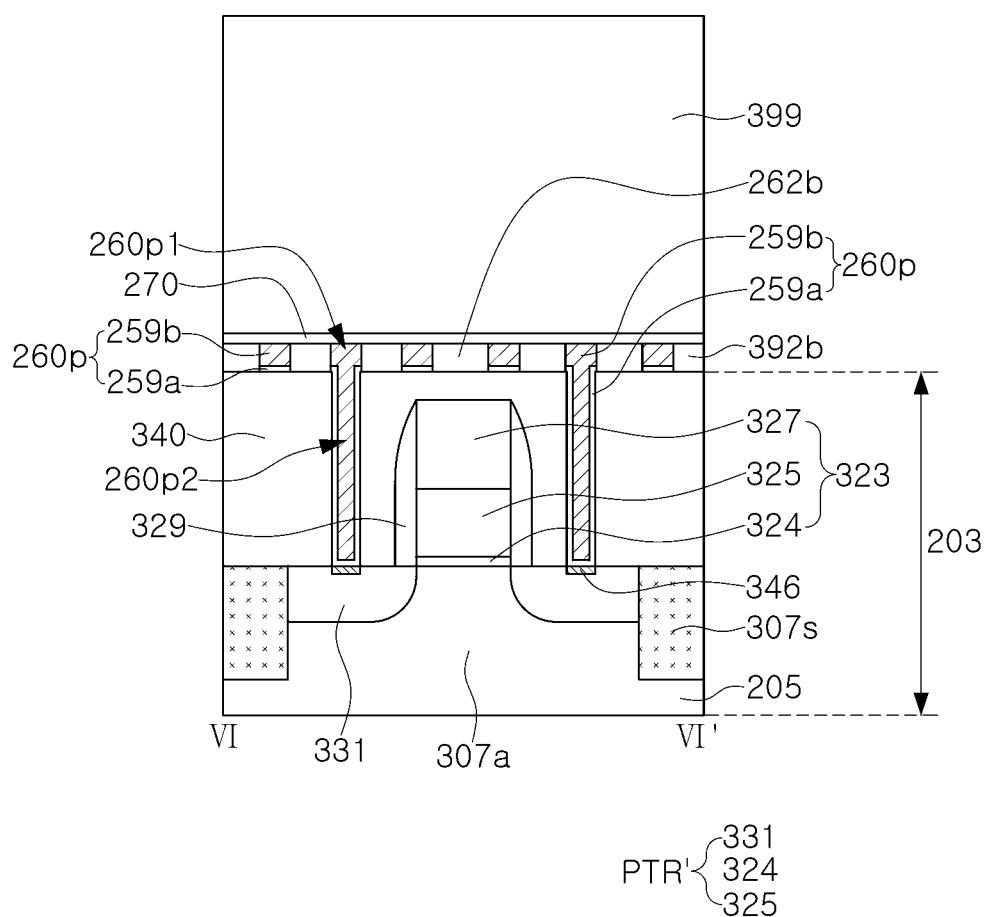
FIG. 4B is a schematic cross-sectional view along line VI-VI' of FIG. 3.

Referring to FIGS. 3, 4A and 4B, a semiconductor device 200 according to an example embodiment may include a lower structure 203, pad patterns 260c, wiring patterns 260p, and a data storage structure 280. The semiconductor device 200 according to an example embodiment may further include first insulating patterns 262a filling between the pad patterns 260c, and second insulating patterns 262b filling between the wiring patterns 260p.

The lower structure 203 may include a semiconductor substrate 205 including a memory cell area MA' and a peripheral circuit area PA'. The lower structure 203 may further include a plurality of first conductive lines 220, channel layers 230c, lower source/drain regions 230s, upper source/drain regions 230d, cell gate electrodes 240, and cell gate dielectrics 250, disposed on the memory cell area MA'.

The channel layers 230c, the lower source/drain regions 230s, the upper source/drain regions 230d, and the cell gate electrodes 240 may form vertical channel transistors CTR'. In this case, the vertical channel transistors CTR' may also be referred to as cell transistors. The vertical channel transistor CTR' may refer to a structure in which a channel length of each of the channel layers 230c extends in a vertical direction Z from the semiconductor substrate 205.

On the peripheral circuit area PA', the lower structure 203 may further include a peripheral active region 307a disposed on the semiconductor substrate 205, a peripheral device isolation region 307s on a side surface of the peripheral active region 307a, a peripheral gate structure 323 disposed on the peripheral active region 307a, and peripheral source/drain regions 331 disposed in the peripheral active region 307a on both sides of the peripheral gate structure 323.

The peripheral gate structure 323 may include a peripheral gate dielectric 324, a peripheral gate electrode 325 on the peripheral gate dielectric 324, and a peripheral gate capping layer 327 on the peripheral gate electrode 325. The peripheral gate capping layer 327 may be formed of an insulating material. The peripheral gate electrode 325 and the peripheral source/drain regions 331 may constitute a peripheral transistor PTR'.

In the peripheral circuit area PA', the lower structure 203 may further include a lower insulating layer 340 covering the peripheral transistor PTR'.

In the memory cell area MA', the lower structure 203 may further include a lower insulating layer 212 disposed on the semiconductor substrate 205. On the lower insulating layer 212, the plurality of first conductive lines 220 may be spaced apart from each other in the first horizontal direction X and extend in the second horizontal direction Y.

On the memory cell area MA', the lower structure 203 may further include a plurality of first lower insulating patterns 222 filling a space between the plurality of first conductive lines 220, on the lower insulating layer 212. The plurality of first lower insulating patterns 222 may extend in the second horizontal direction Y, and upper surfaces of the plurality of first lower insulating patterns 222 may be disposed on the same level as upper surfaces of the plurality of first conductive lines 220. The plurality of first conductive lines 220 may function as bit lines of the semiconductor device 200 according to an example embodiment.

In example embodiments, the plurality of first conductive lines 220 may include doped polysilicon, a metal, a conductive metal nitride, a conductive metal silicide, a conductive metal oxide, or combinations thereof. For example, the plurality of first conductive lines 220 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or combinations thereof, but are not limited thereto. The plurality of first conductive lines 220 may include a single layer or multiple layers of the aforementioned materials. In example embodiments, the plurality of first conductive lines 220 may include a 2D semiconductor material, e.g., graphene, carbon nanotubes, or a combination thereof.

The channel layers 230c may be arranged in a matrix form to be spaced apart from each other in the first horizontal direction X and the second horizontal direction Y, on the plurality of first conductive lines 220. The lower source/drain regions 230s, the channel layers 230c, and the upper source/drain regions 230d may be sequentially stacked. In example embodiments, one channel layer 230c and the lower and upper source/drain regions 230s and 230d disposed below/on the one channel layer 230c may have a first width in the second horizontal direction X and a first height in a vertical direction Z, and the first height may be greater than the first width. For example, the first height may be about 2 to about 10 times the first width, but is not limited thereto.

In example embodiments, the channel layers 230c may include an oxide semiconductor. For example, the oxide semiconductor may include In$_x$Ga$_y$Zn$_z$O, In$_x$Ga$_y$Si$_z$O, In$_x$Sn$_y$Zn$_z$O, In$_x$Zn$_y$O, Zn$_x$O, Zn$_x$Sn$_y$O, Zn$_x$O$_y$N, Zr$_x$Zn$_y$Sn$_z$O, Sn$_x$O, Hf$_x$In$_y$Zn$_z$O, Ga$_x$Zn$_y$Sn$_z$O, Al$_x$Zn$_y$Sn$_z$O, Yb$_x$Ga$_y$Zn$_z$O, In$_x$Ga$_y$O, or combinations thereof. The channel layers 230c may include a single layer or multiple layers of the oxide semiconductor. In some examples, the channel layers 230c may have a band gap energy greater than that of silicon. For example, the channel layers 230c may have a band gap energy of about 1.5 eV to about 5.6 eV. For example, when the channel layer 230c has a band gap energy of about 2.0 eV to about 4.0 eV, the channel layer 230c may have optimal channel performance. For example, the channel layers 230c may be polycrystalline or amorphous, but are not limited thereto.

In example embodiments, the channel layers 230c may include a 2D semiconductor material, e.g., graphene, carbon nanotubes, or a combination thereof. In example embodiments, the channel layers 230c may include a semiconductor material, e.g., silicon or the like.

Hereinafter, a description will be provided focusing on one channel layer 230c and one cell gate electrode 240.

The cell gate electrode 240 may extend in the second horizontal direction X on both sidewalls of the channel layer 230c. The cell gate electrode 240 may include a first sub-gate electrode 240P1 facing a first sidewall of the channel layer 230c, and a second sub-gate electrode 240P2 facing a second sidewall of the channel layer 230c opposite to the first sidewall. As one channel layer 230c is disposed between the first sub-gate electrode 240P1 and the second sub-gate electrode 240P2, the semiconductor device 200 according to an example embodiment may have a dual gate transistor structure. However, embodiments are not limited thereto, and the second sub-gate electrode 240P2 is omitted and only the first sub-gate electrode 240P1 facing the first sidewall of the channel layer 230c may also be formed to implement a single gate transistor structure.

The cell gate electrode 240 may include doped polysilicon, metal, conductive metal nitride, conductive metal silicide, conductive metal oxide, or combinations thereof. For example, the cell gate electrode 240 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof, but the material thereof is not limited thereto.

The cell gate dielectric 250 may surround a sidewall of the channel layer 230c and may be interposed between the channel layer 230c and the cell gate electrode 240. For example, as illustrated in FIG. 3, the entire sidewall of the channel layer 230c may be surrounded by the cell gate dielectric 250, and a portion of the sidewall of the cell gate electrode 240 may contact the cell gate dielectric 250. In other embodiments, the cell gate dielectric 250 extends in an extension direction of the cell gate electrode 240, e.g., in a second horizontal direction X, and among sidewalls of the channel layer 230c, only two sidewalls facing the cell gate electrode 240 may contact the cell gate dielectric 250.

In example embodiments, the cell gate dielectric 250 may be formed of a silicon oxide film, a silicon oxynitride film, a high dielectric film having a higher dielectric constant than that of the silicon oxide film, or combinations thereof. The high dielectric film may be formed of a metal oxide or a metal oxynitride. For example, the high dielectric film usable as the cell gate dielectric 250 may be formed of $HfO_2$, HfSiO, HfSiON, HfTaO, HfTiO, HfZrO, $ZrO_2$, $Al_2O_3$, or combinations thereof, but is not limited thereto.

On the memory cell area MA', the lower structure 203 may further include a plurality of second lower insulating patterns 232 disposed on the plurality of first lower insulating patterns 222. The second lower insulating patterns 232 may extend in the second horizontal direction Y, and the channel layer 230c may be disposed between adjacent two second lower insulating patterns 232 among the plurality of second lower insulating patterns 232.

On the memory cell area MA', the lower structure 203 may further include a first buried layer 234 and a second buried layer 236 disposed in a space between two adjacent channel layers 230c, between two adjacent second lower insulating patterns 232. The first buried layer 234 is disposed on the bottom of the space between two adjacent channel layers 230c, and the second buried layer 236 may be formed to fill the remainder of the space between two adjacent channel layers 230c, on the first buried layer 234. The upper surface of the second buried layer 236 is disposed on the same level as the upper surface of the channel layer 230c, and the second buried layer 236 may cover the upper surface of the cell gate electrode 240. Unlike this, the plurality of second lower insulating patterns 232 may be formed as a material layer continuous with the plurality of first lower insulating patterns 222, or the second buried layer 236 may be formed as a material layer continuous with the first buried layer 234.

The pad patterns 260c disposed on the memory cell area MA' and the wiring patterns 260p disposed on the peripheral circuit area PA' may be formed of the same material. The pad patterns 260c may be disposed on the upper source/drain region 230d. The pad patterns 260c may be vertically overlapped with the channel layers 230c, respectively, and may be arranged in a matrix form, to be spaced apart in the first horizontal direction X and the second horizontal direction Y. The pad patterns 260c and the wiring patterns 260p may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof, but are not limited thereto.

For example, each of the pad patterns 260c and the wiring patterns 260p may include a first conductive material layer 259a and a second conductive material layer 259b on the first conductive material layer 259a. In another example, contact patterns may be disposed between the second source/drain regions 230d and the pad patterns 260c. For example, in FIG. 4A, reference numeral 259a may be referred to as a contact pattern, and reference numeral 259b may be referred to as a pad pattern.

At least one of the wiring patterns 260p may include a wiring portion 260p1 on the lower structure 203, and a plug portion 260p2 extending from the wiring portion 260p1 into the lower structure 203 and electrically connected to the peripheral transistor PTR'.

In example embodiments, the lower structure 203 may further include a metal-semiconductor compound layer 346 electrically connecting the peripheral source/drain region 331 and the plug portion 260p2, between the peripheral source/drain region 331 and the plug portion 260p2.

Each of the pad patterns 260c may have a first side (S1) and a second side (S2) that oppose each other and are parallel to each other, and a third side (S3) and a fourth side (S4) that oppose each other and are parallel to each other. Each of the pad patterns 260c has the first to fourth sides S1, S2, S3 and S4, and may have a rounded shape in areas in which the first to fourth sides S1, S2, S3 and S4 meet each other. For example, when viewed in a plan view, each of the pad patterns 260c has edges such as the first to fourth sides S1, S2, S3 and S4, and may have a rounded shape in portions in which the edges S1, S2, S3 and S4 are adjacent to each other. In example embodiments, each of the pad patterns 260c may have an oval shape, a circle shape, or a quadrangular shape in which vertices are rounded.

In example embodiments, when viewed in a plan view, in each of the pad patterns 260c, the first and second sides S1 and S2 may have a line shape extending in a diagonal direction D1' forming an acute angle with respect to the first horizontal direction X, and the third and fourth sides S3 and S4 may have a line shape extending in a second diagonal direction D2' forming an obtuse angle with respect to the first horizontal direction X. In example embodiments, in a plan view, among the pad patterns 260c, in pad patterns sequentially arranged in the first diagonal direction D1', the first sides S1 may be aligned in the first diagonal direction D1', and the second sides S2 may be aligned in the first diagonal direction D1'.

In example embodiments, in a plan view, among the pad patterns 260c, in the pad patterns sequentially arranged in the second diagonal direction D2', the third sides S3 may be aligned in the second diagonal direction D2, and the fourth sides S4 may be aligned in the second diagonal direction D2'.

On the memory cell area MA', the lower structure 203 may further include first insulating patterns 262a. The first insulating patterns 262a may surround sidewalls of the pad patterns 260c, on the plurality of second lower insulating patterns 232 and the second buried layer 236.

On the memory cell area MA', the lower structure 203 may further include an etch stop layer 270 disposed on the first insulating patterns 262a, and a data storage structure 280 disposed on the etch stop layer 270.

In example embodiments, the data storage structure 280 may be a capacitor that stores information in a DRAM. For example, the data storage structure 280 may include first electrodes 282, a dielectric layer 284, and a second electrode 286. The first electrodes 282 may penetrate through the etch stop layer 270 and are electrically connected to the upper surfaces of the pad patterns 260c. The first electrodes 282 may be formed in a pillar type extending in the vertical direction Z, but are not limited thereto. In example embodiments, the first electrodes 282 may be disposed to vertically overlap the pad patterns 260c and may be arranged in a matrix form to be spaced apart in the first horizontal direction X and the second horizontal direction Y.

In another embodiment, the data storage structure 280 may be a data storage structure capable of storing information in a nonvolatile memory device, e.g., an MRAM device or a variable resistance memory device.

Figure 5A:
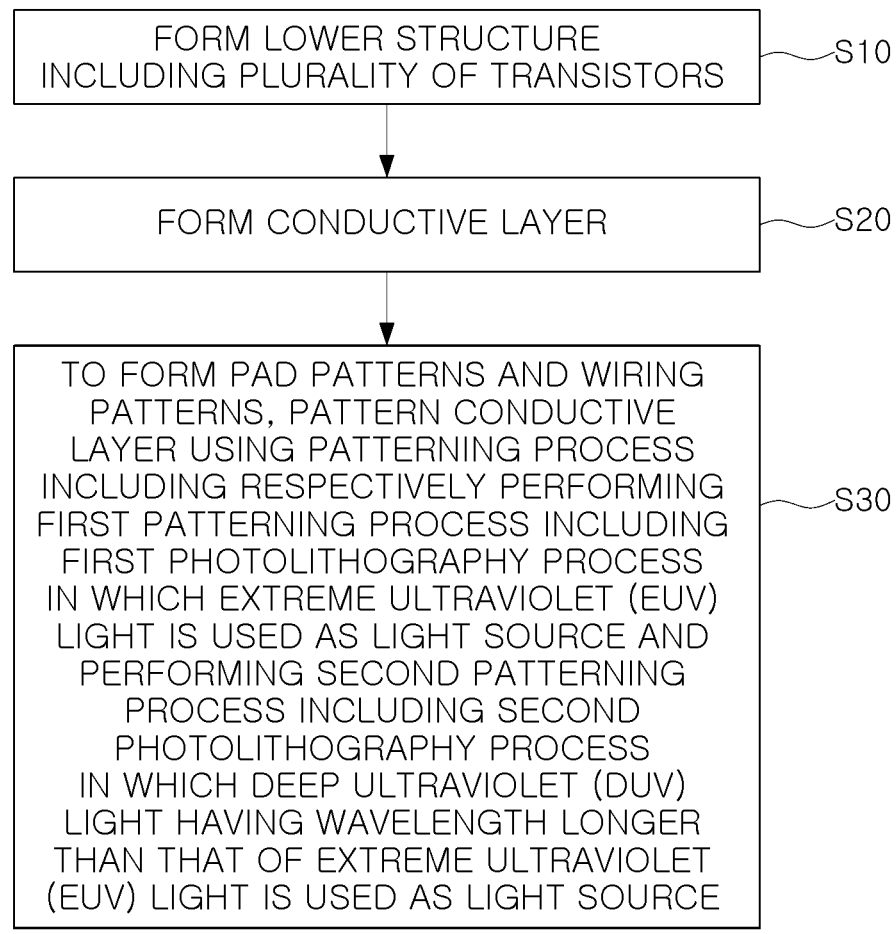
FIGS. 5A and 5B are process flow diagrams of a method of manufacturing a semiconductor device according to an example embodiment.

Next, example embodiments of a method of manufacturing a semiconductor device according to an example embodiment will be described with reference to FIG. 5A. FIG. 5A is a flowchart schematically illustrating a method of manufacturing a semiconductor device according to an example embodiment.

Referring to FIG. 5A, a lower structure including a plurality of transistors may be formed (S10). For example, the lower structure may be the lower structure 3 described with reference to FIGS. 1A to 2B. In another example, the lower structure may be the lower structure 203 described with reference to FIGS. 3 to 4B.

Next, a conductive layer may be formed on the lower structure (S20). For example, the conductive layer may be formed of the same material as the pad patterns 49c and the wiring patterns 49p described with reference to FIGS. 1A to 2B. In another example, the conductive layer may be formed of the same material as the pad patterns 260c and the wiring patterns 260p described with reference to FIGS. 3 to 4B.

Subsequently, the conductive layer may be patterned to form pad patterns and the wiring patterns (S30). The pad patterns and the wiring patterns may be formed by using a patterning process including respectively performing a first patterning process including a first photolithography process, in which extreme ultraviolet (EUV) light is used as a light source, and performing a second patterning process including a second photolithography process, in which deep ultraviolet (DUV) light having a wavelength longer than that of the EUV light is used as a light source.

For example, the pad patterns and the wiring patterns may be the pad patterns 49c and the wiring patterns 49p described with reference to FIGS. 1A to 2B. In another example, the pad patterns and the wiring patterns may be the pad patterns 260c and the wiring patterns 260p described with reference to FIGS. 3 to 4B.

Figure 5B:
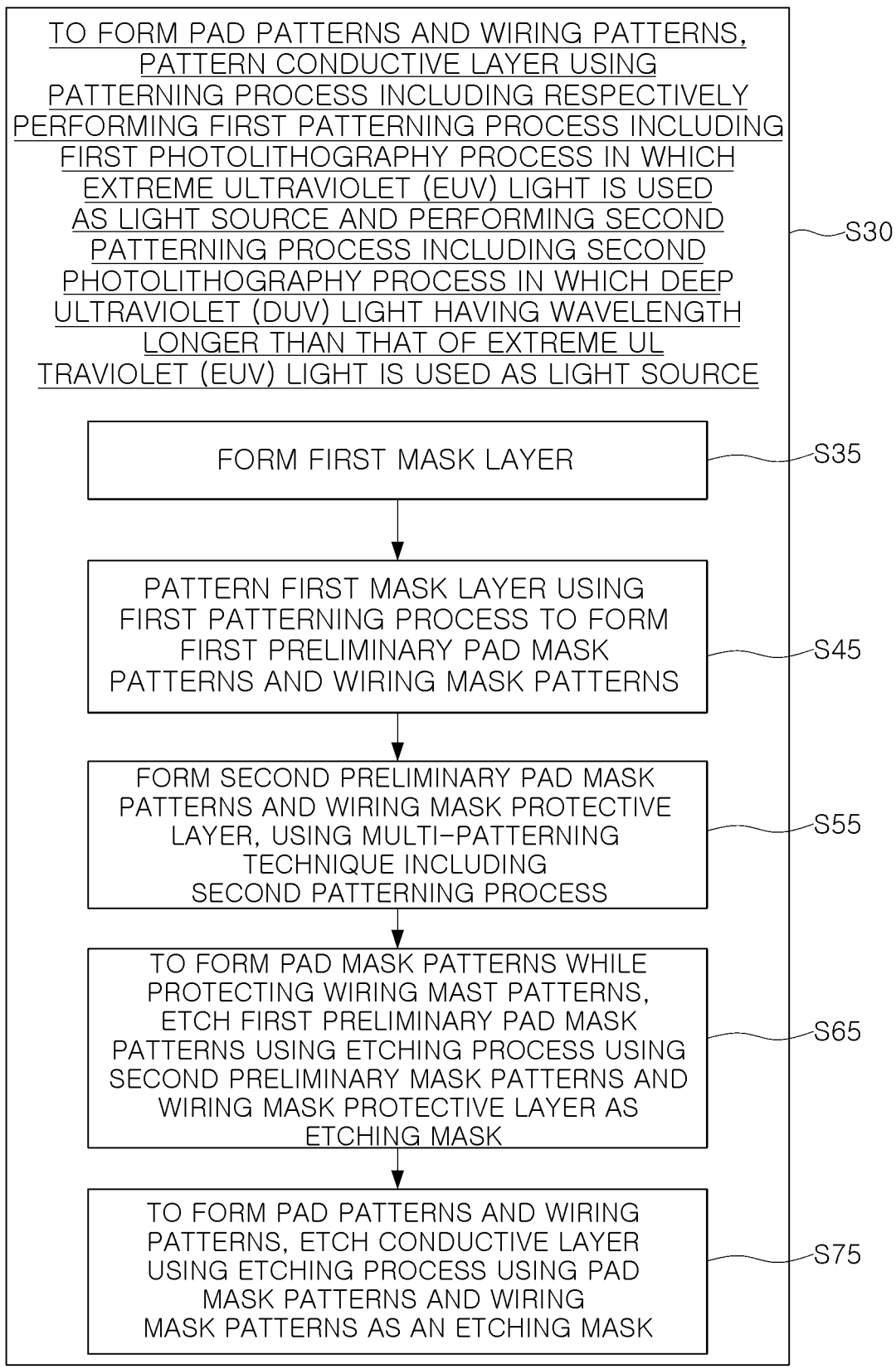
Figure 6A:
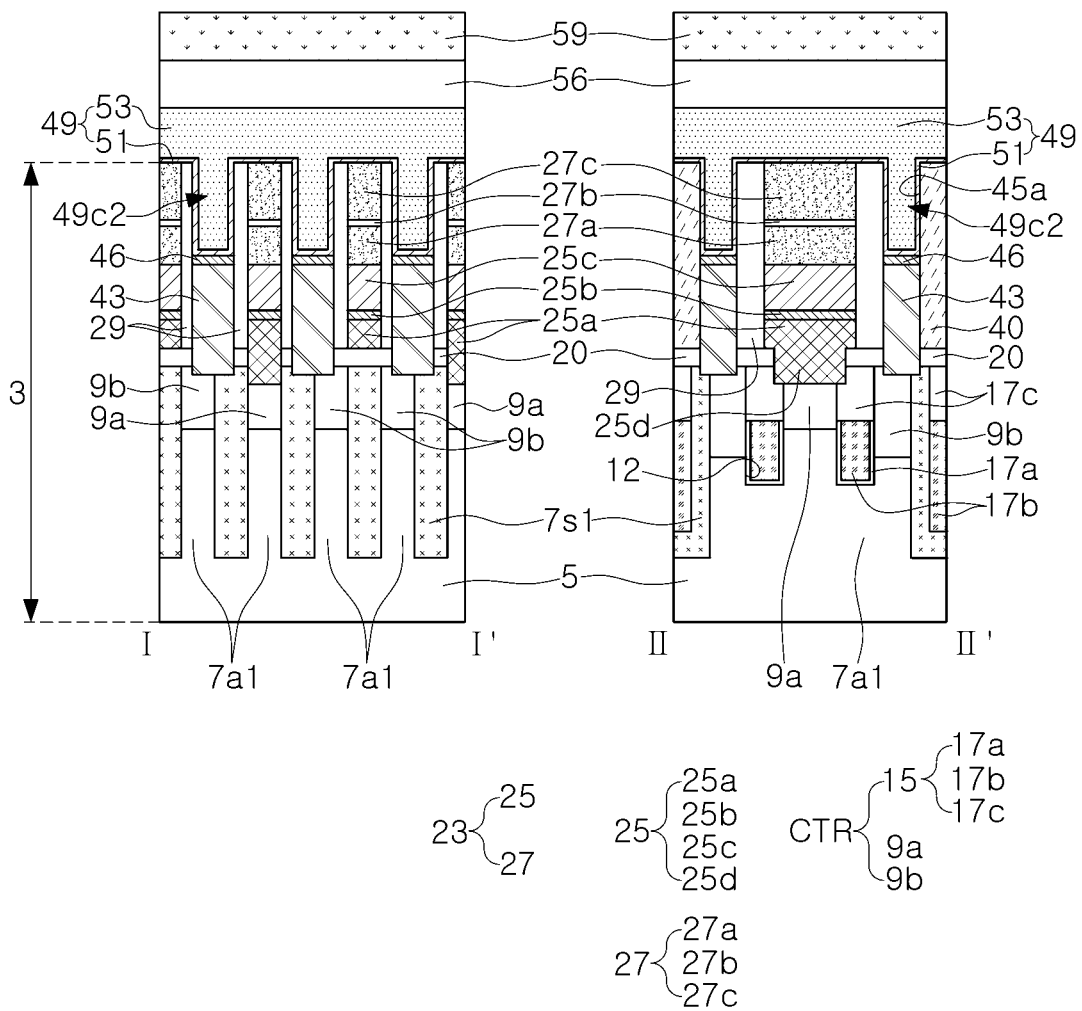
FIGS. 6A to 19B are cross-sectional views of stages in a method of manufacturing a semiconductor device according to an example embodiment.
Figure 6B:
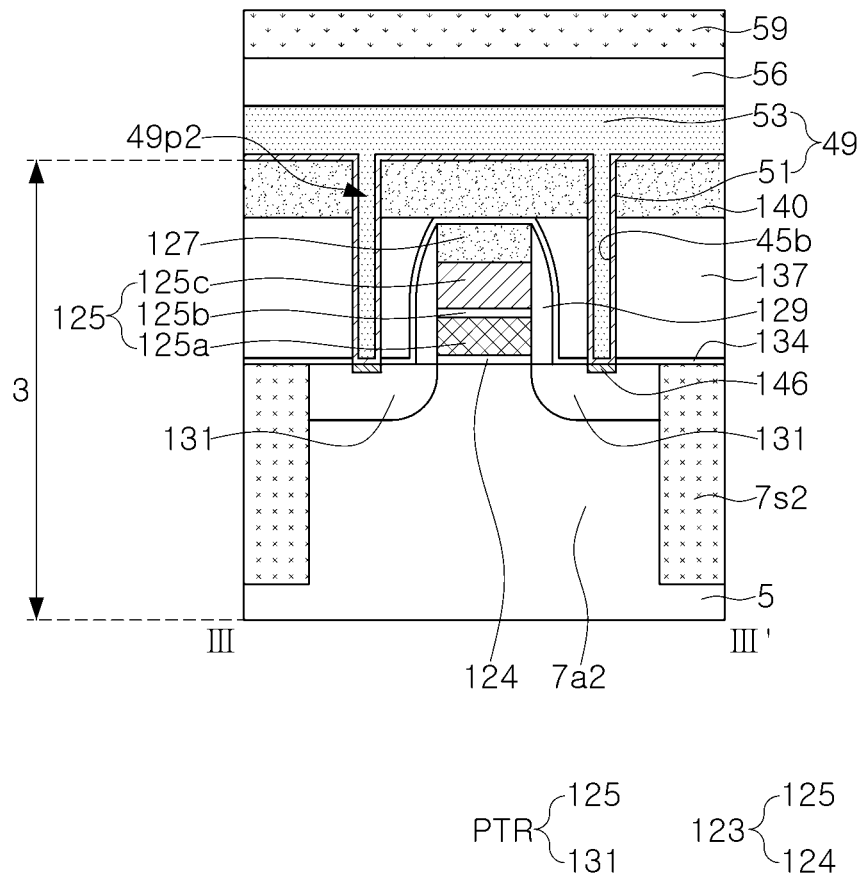

Next, with reference to FIG. 5B, operation S30 will be described in detail. FIG. 5B is a process flow diagram of stages in operation S30 described in FIG. 5A.

Referring to FIG. 5B, a first mask layer may be formed (S35), the first mask layer may be patterned using a first patterning process to form first preliminary pad mask patterns and wiring mask patterns (S45), second preliminary pad mask patterns and a wiring mask protective layer may be formed using a multi-patterning technique including a second patterning process (S55), the first preliminary pad mask patterns may be etched using an etching process using the second preliminary mask patterns and the wiring mask protective layer as an etching mask to form the pad mask patterns while protecting the wiring mast patterns (S65), and a conductive layer may be etched using an etching process using the pad mask patterns and the wiring mask patterns as an etching mask to form the pad patterns and wiring patterns (S75). Accordingly, pad patterns and wiring patterns as described in FIG. 5A may be formed. Accordingly, operation S30 described in FIG. 5A may include operations S35, S45, S55, S65, and S75 described with reference to FIG. 5B.

Next, example embodiments of a method of manufacturing a semiconductor device according to an example embodiment will be described mainly with reference to FIGS. 6A to 19B. FIGS. 6A to 19B are cross-sectional views of stages in a method of manufacturing a semiconductor device according to an example embodiment. FIGS. 6A, 8A, 10A, 11A, 12A, 13A, 14A, 16, 17A, 18, and 19A illustrate cross-sectional views along lines I-I' and II-II' of FIG. 1A of stages in the method of manufacturing a semiconductor device according to an example embodiments. FIGS. 6B, 8B, 10B, 11B, 12B, 13B, 14B, 17B, and 19B illustrate cross-sectional views along line III-III' of FIG. 1A of stages in a method of manufacturing a semiconductor device according to an example embodiment. FIGS. 7, 9A, 9B and 15 illustrate plan views of stages in the method of manufacturing a semiconductor device according to an example embodiment.

Referring to FIGS. 1A, 5A, 5B, 6A, and 6B, the lower structure 3 including the plurality of transistors CTR and PTR may be formed (see S10 in FIG. 5A). As described in FIG. 5A, the lower structure 3 may be the lower structure 3 described with reference to FIGS. 1A to 2B, but embodiments not limited thereto. For example, the lower structure 3 may be replaced with the lower structure 203 described with reference to FIGS. 3 to 4B.

A conductive layer 49 may be formed (see S20 in FIG. 5A). In example embodiments, forming the conductive layer 49 may include forming first openings 45a exposing upper surfaces of the contact plugs 43 on the memory cell area MA and second openings 45b exposing the second source/drain regions 131 on the peripheral circuit area PA, by etching a portion of the lower structure 3, and forming a conductive material layer covering the upper surface of the lower structure 3 while filling the first and second openings 45a and 45b. The conductive layer 49 may include a first conductive material layer 51 and a second conductive material layer 53 that are sequentially formed.

In example embodiments, after forming the first and second openings 45a and 45b, before forming the conductive material layer filling the first and second openings 45a and 45b, first metal-semiconductor compound layers 46 and second metal-semiconductor compound layers 146 may be formed on the exposed surfaces of the contact plugs 43 and the exposed surfaces of the second source/drain regions 131, respectively. For example, the first and second metal-semiconductor compound layers 46 and 146 may include the same material, e.g., metal silicides such as TiSi, CoSi, WSi, TaSi, NiSi, MoSi or the like.

A lower layer 56 may be formed on the conductive layer 49. The lower layer 56 may be formed of a material having etch selectivity with respect to the conductive layer 49. For example, the lower layer 56 may be formed of an amorphous carbon layer, a polysilicon layer, a silicon oxide, a silicon nitride, a silicon oxynitride, or combinations thereof, but the material is not limited thereto. The lower layer 56 may be formed of a single layer or multiple layers of the aforementioned materials.

The first mask layer 59 may be formed (35 in FIG. 5B). The first mask layer 59 may be formed on the lower layer 56.

The first mask layer 59 may be formed of an amorphous carbon layer, a polysilicon layer, a silicon oxide layer, a silicon nitride layer, a silicon oxynitride layer, or combinations thereof, but the configuration is not limited thereto. The lower layer 56 may be formed of a single layer or multiple layers of the aforementioned materials.

In example embodiments, a portion of the first mask layer 59 and a portion of the lower layer 56 adjacent to each other may be formed of different materials.

Referring to FIGS. 1A, 5B, 7, 8A and 8B, the first mask layer (59 in FIGS. 6A and 6B) may be patterned using the first patterning process (see S45 in FIG. 5B) to form first preliminary pad mask patterns 59a and wiring mask patterns 59b. Accordingly, forming the first preliminary pad mask patterns 59a and the wiring mask patterns 59b may include forming the first mask layer 59 on the conductive layer 49, and patterning the first mask layer (59 in FIGS. 6A and 6B) using the first patterning process using the first photolithography process in which EUV light is used as a light source.

The first patterning process may include a first photolithography process using EUV light as a light source, as described in operation S30 in FIGS. 5A and 5B. In example embodiments, the EUV light may have a wavelength between about 4 nm and about 124 nm, e.g., about 4 nm to about 20 nm. For example, the EUV light may have a wavelength of about 13.5 nm. The first photolithography process may use a reflective EUV photomask that reflects extreme ultraviolet rays.

Figure 7:
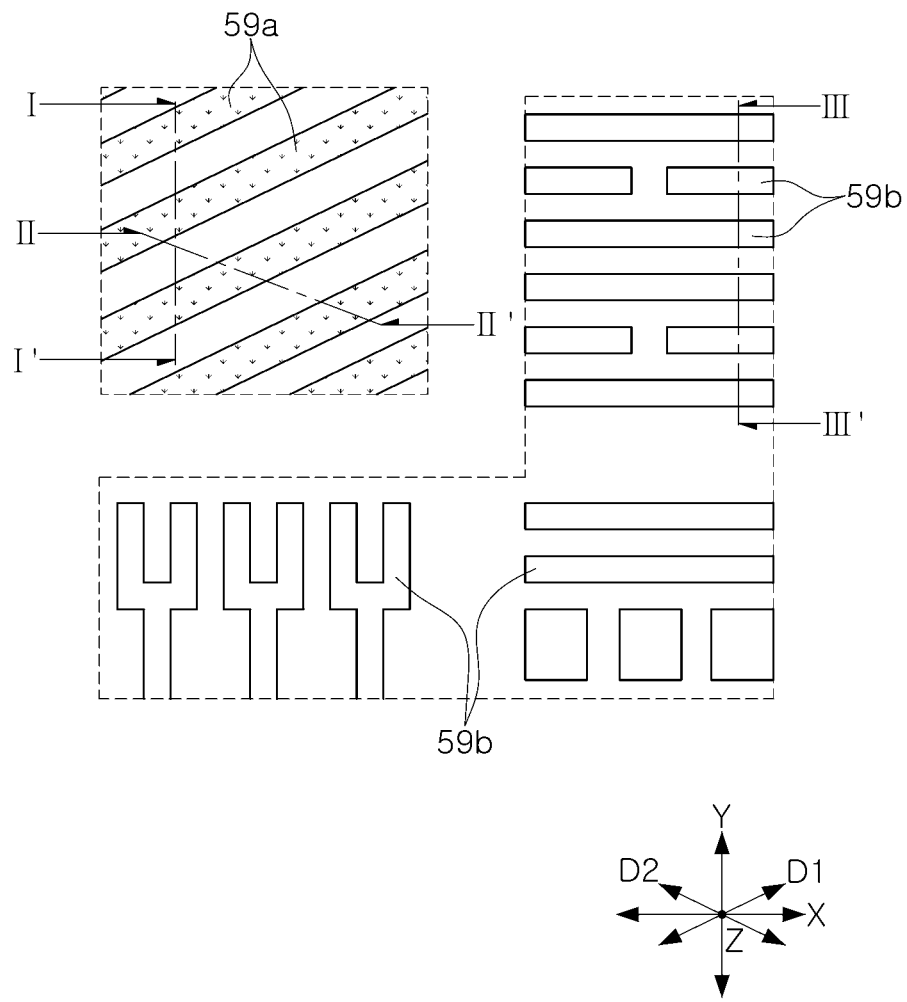

For example, as illustrated in FIG. 7, at least one of the wiring mask patterns 59b has a first line shape extending in the first horizontal direction X, and each of the first preliminary pad mask patterns 59a may have a second line shape extending in the first diagonal direction D1 forming an acute or obtuse angle with respect to the first horizontal direction.

For example, the wiring mask patterns 59b may include a wiring mask pattern having a line shape extending in the first horizontal direction X or a wiring mask pattern having a line shape extending in a second horizontal direction Y perpendicular to the first horizontal direction X. For example, if the wiring mask patterns 59b extends in the first horizontal direction X, the first diagonal direction D1 may form an acute angle with respect to the first horizontal direction X. In another example, if the wiring mask patterns 59b extending in the second horizontal direction Y, the first diagonal direction D1 may form an obtuse angle with respect to the second horizontal direction Y.

Referring to FIGS. 1A, 9A, 9B, 10A, and 10B, a second mask layer 62 covering the first preliminary pad mask patterns 59a and the wiring mask patterns 59b, on the lower layer 56, may be formed. The second mask layer 62 may include a first material layer 64a, and a second material layer 64b on the first material layer 64a. The first material layer 64a and the second material layer 64b may be formed of different materials. For example, the first material layer 64a and the second material layer 64b may be formed of different layers, e.g., the first material layer 64a and the second material layer 64b may independently include an amorphous carbon layer, a polysilicon layer, a silicon oxide layer, a silicon nitride layer, a silicon oxynitride layer, and/or a spin on hardmask (SOH) material layer.

An upper layer 67 may be formed on the second mask layer 62. The upper layer 67 may include a first upper material layer 69a, and a second upper material layer 69b on the first upper material layer 69a. The first upper material layer 69a and the second upper material layer 69b may be formed of different materials. For example, the first upper material layer 69a and the second upper material layer 69b may be formed of different layers, e.g., the first upper material layer 69a and the second upper material layer 69b may independently include an amorphous carbon layer, a polysilicon layer, a silicon oxide layer, a silicon nitride layer, a silicon oxynitride layer, and/or a spin on hardmask (SOH) material layer.

A capping mask layer 72 may be formed on the upper layer 67. The capping mask layer 72 may be formed of, e.g., an amorphous carbon layer, a polysilicon layer, a silicon oxide layer, a silicon nitride layer, a silicon oxynitride layer, or combinations thereof, but the configuration is not limited thereto. The capping mask layer 72 may be formed of a single layer or multiple layers of the aforementioned materials.

Referring to FIGS. 1A, 9A, 9B, 11A, and 11B, the capping mask layer (72 in FIGS. 10A and 10B) may be patterned to form capping mask patterns 72a and a protective mask pattern 72b, by using a second photolithography process in which DUV light having a wavelength longer than a wavelength of the EUV light is used as a light source.

In example embodiments, the DUV light may be an ArF excimer laser having a wavelength of about 193 nm, but is not limited thereto, and may be a g-line of a wavelength of about 436 nm, an i-line (365 nm) of a wavelength of about 365 nm, or a KrF laser of a wavelength of about 248 nm. In example embodiments, the second photolithography process may use a transmissive photomask. In example embodiments, the second photolithography process may be a photolithography process using immersion ArF exposure equipment.

In example embodiments, each of the capping mask patterns 72a may have a line shape extending in a second diagonal direction D2 forming an obtuse angle with respect to the first horizontal direction X. The second diagonal direction D2 may intersect the first diagonal direction D1. Accordingly, the capping mask patterns 72a may intersect the first preliminary pad mask patterns 59a.

The protective mask pattern 72b may have a plate shape covering the wiring mask patterns 59b. For example, the protective mask pattern 72b may cover the wiring mask patterns 59b and the entire space between the wiring mask patterns 59b.

Each of the first preliminary pad mask patterns 59a may be formed to have a first width, and each of the capping mask patterns 72a may be formed to have a second width greater than the first width. The first preliminary pad mask patterns 59a may be spaced apart at a first interval, and the capping mask patterns 72a may be spaced apart at a second interval greater than the first interval.

A first liner layer 77 may be formed to cover the capping mask patterns 72a and the protective mask pattern 72b with a substantially uniform thickness, on the upper layer 67. The first liner layer 77 may be formed by an atomic layer deposition process. For example, the first liner layer 77 may be formed of silicon oxide.

An upper capping layer 80 overlapping the protective mask pattern 72b may be formed on the first liner layer 77. The upper capping layer 80 may not overlap the capping mask patterns 72a. The upper capping layer 80 may be a photoresist layer.

Figure 11A:
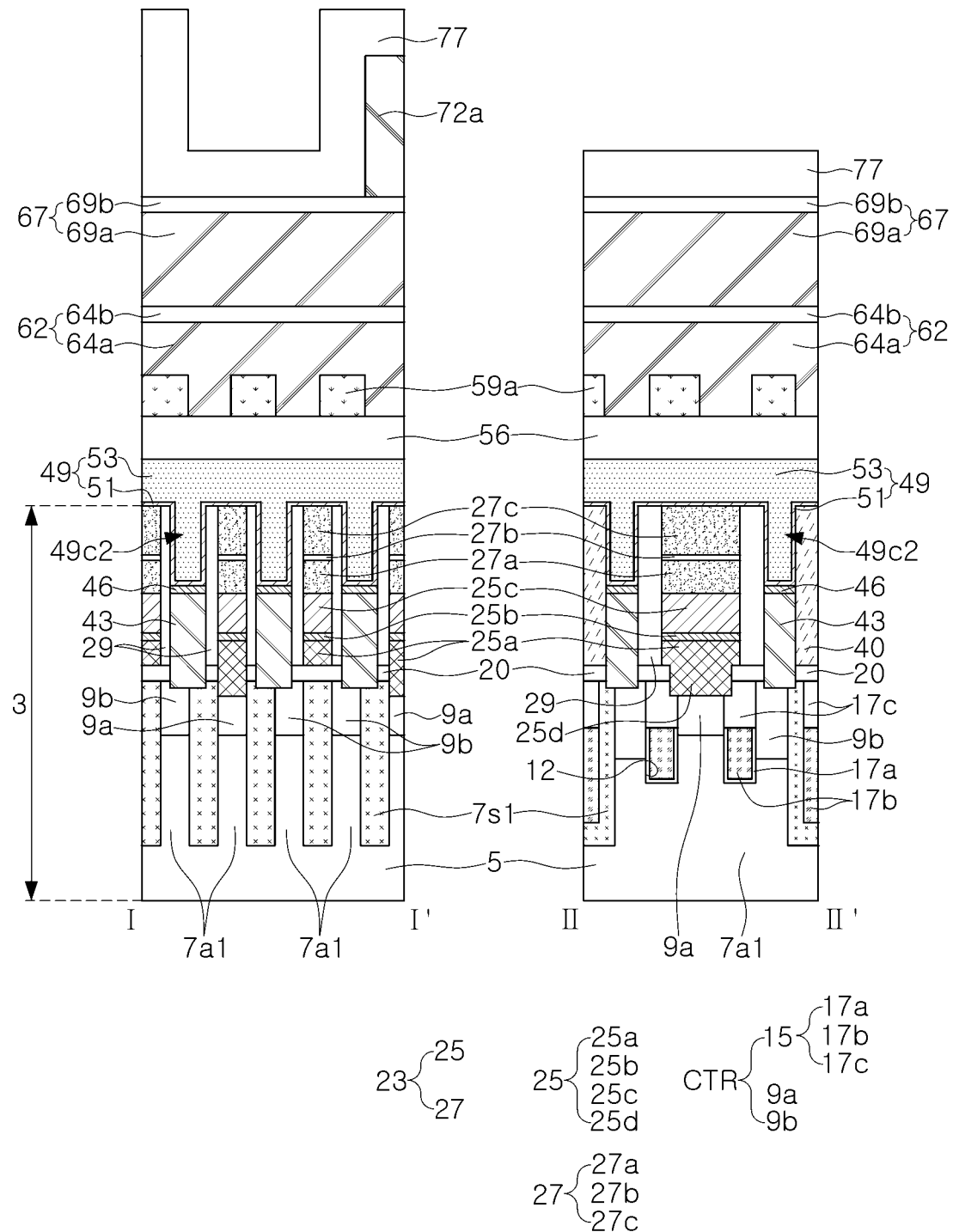
Figure 11B:
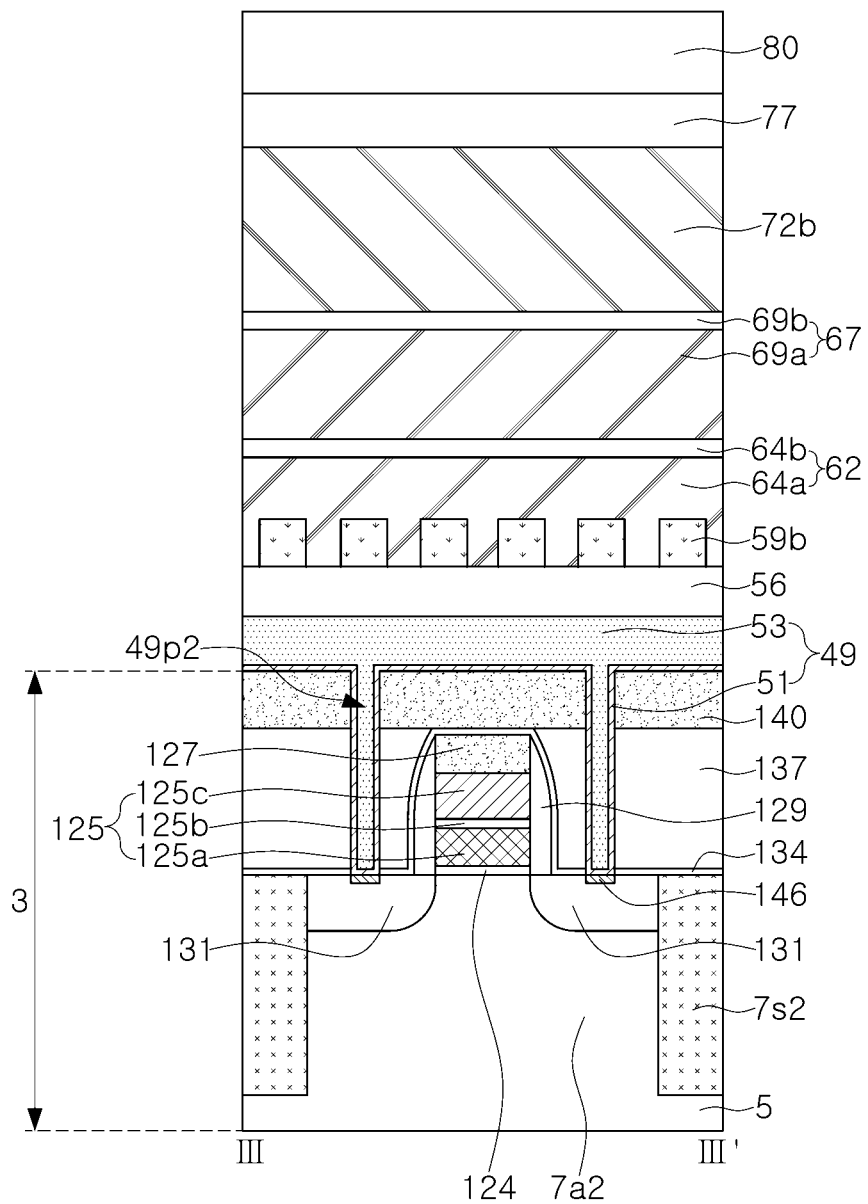
Figure 12A:
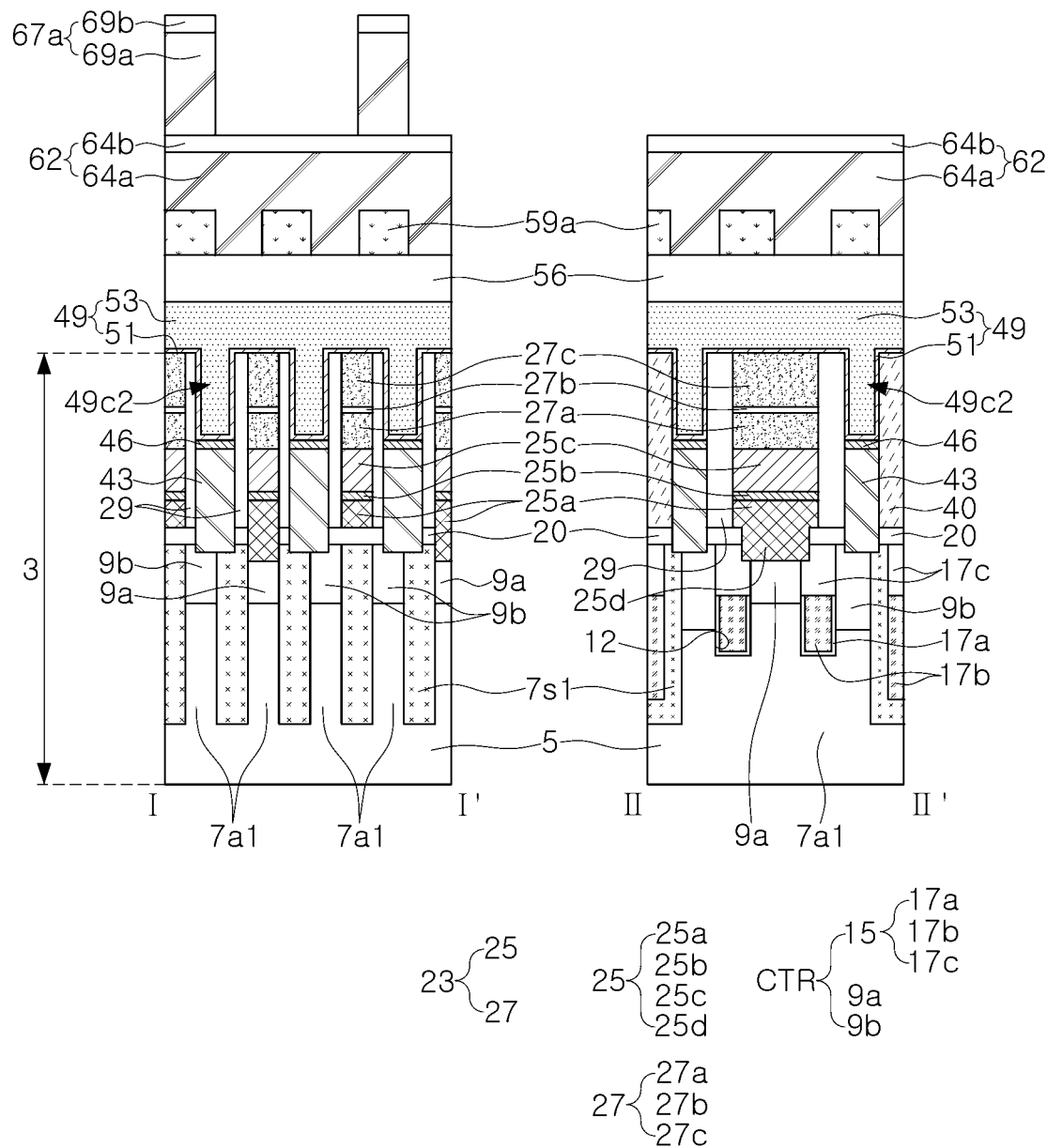
Figure 12B:
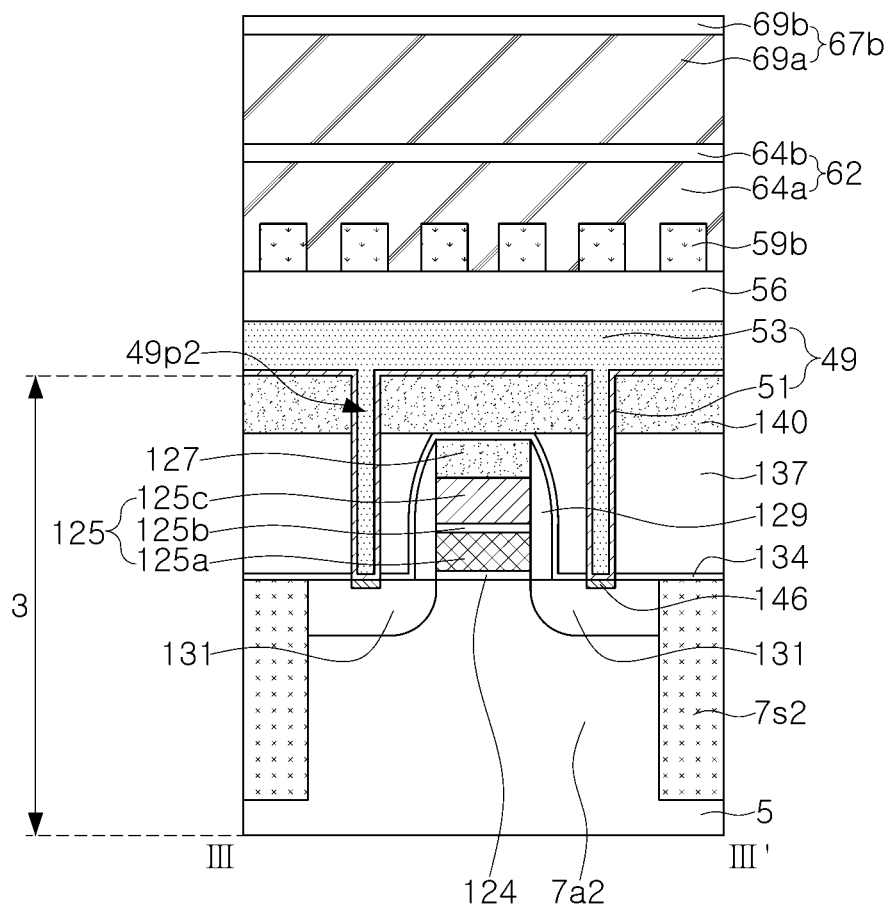

Referring to FIGS. 1A, 12A, and 12B, the first liner layer (77 in FIG. 11A) that does not overlap with the upper capping layer 80 is anisotropically etched to form portions of the first liner layer (77 in FIG. 11A) remaining on side surfaces of the capping mask patterns (72a in FIG. 11A). The upper capping layer (80 in FIG. 11B) and the capping mask patterns (72a in FIG. 11A) may be removed.

To form first upper patterns 67*a* and an upper protective layer 67*b*, the upper layer 67 is etched using an etching process using the first liner layer (77 in FIG. 11A) as an etching mask, and in addition, the first liner layer (77 in FIG. 11B) and the protective mask pattern 72*b* may be removed. The upper protective layer 67*b* may be formed below the protective mask pattern 72*b*.

Figure 13A:
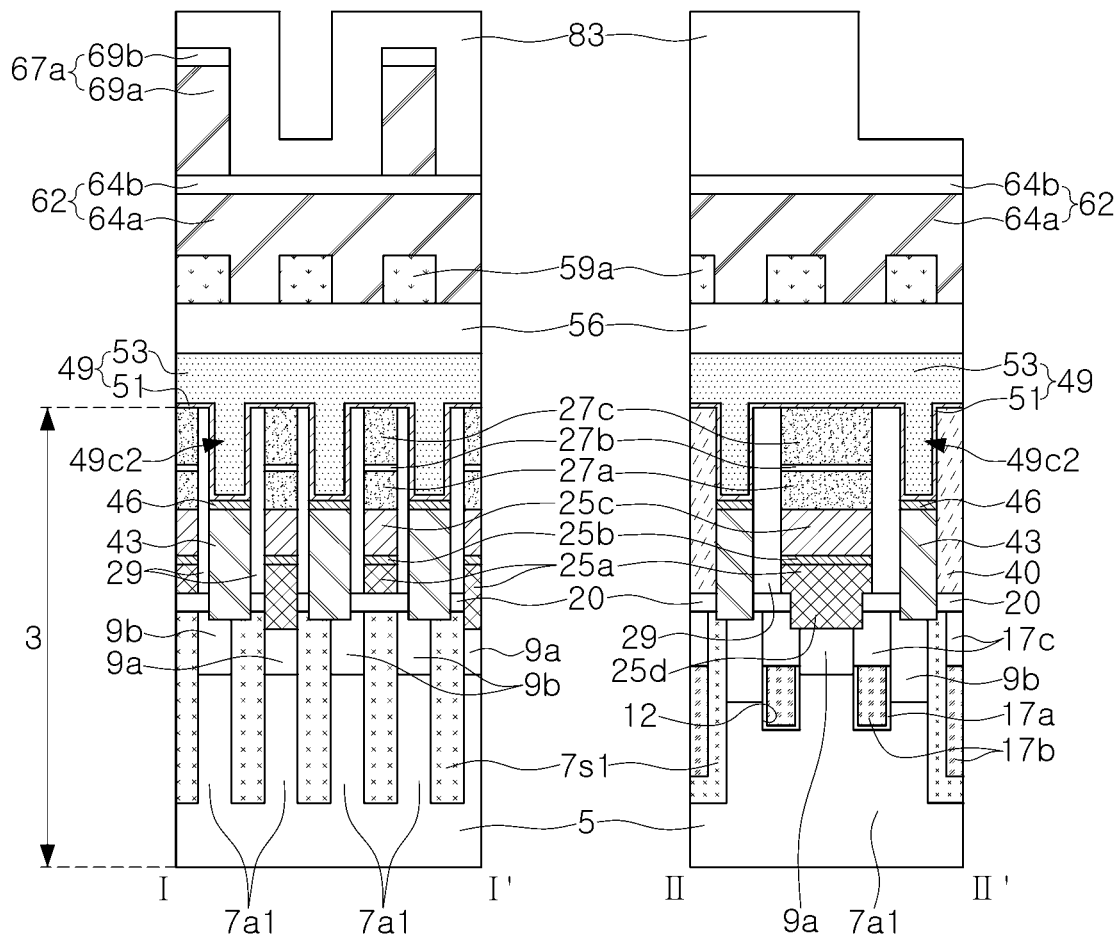
Figure 13B:
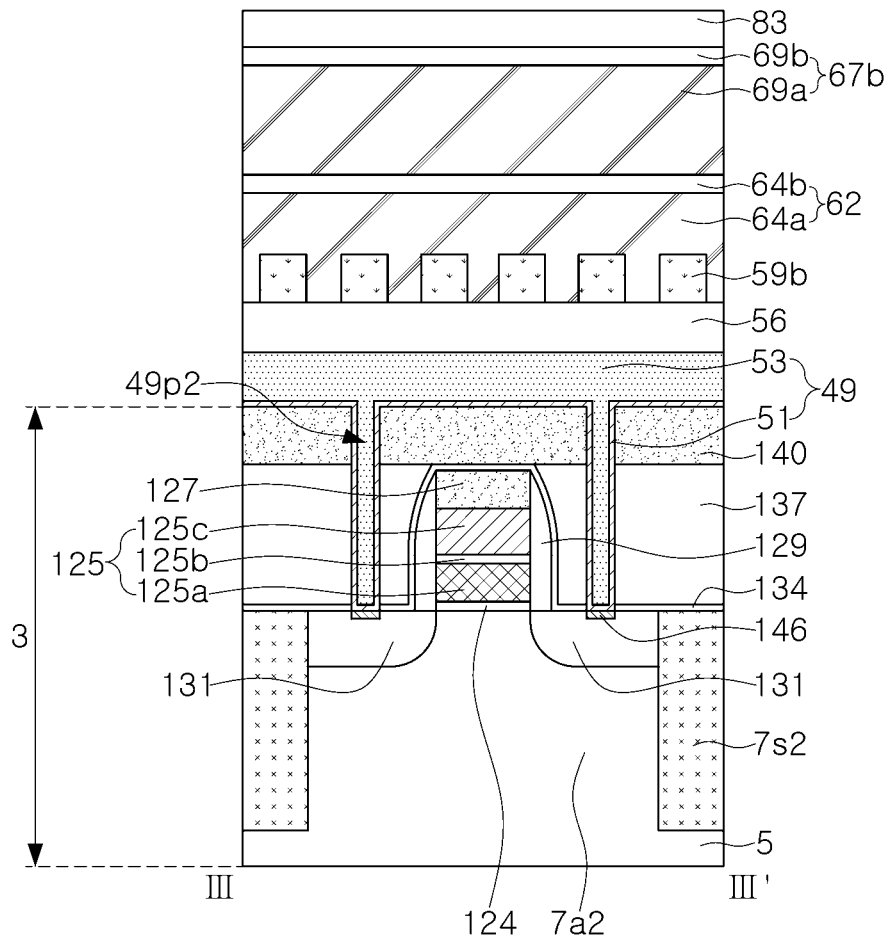

Referring to FIGS. 1A, 13A, and 13B, a second liner layer 83 may be formed to cover the first upper patterns 67*a* and the upper protective layer 67*b* with a substantially uniform thickness, on the second mask layer 62. The second liner layer 83 may be formed by an atomic layer deposition process. For example, the second liner layer 83 may be formed of silicon oxide.

Figure 14A:
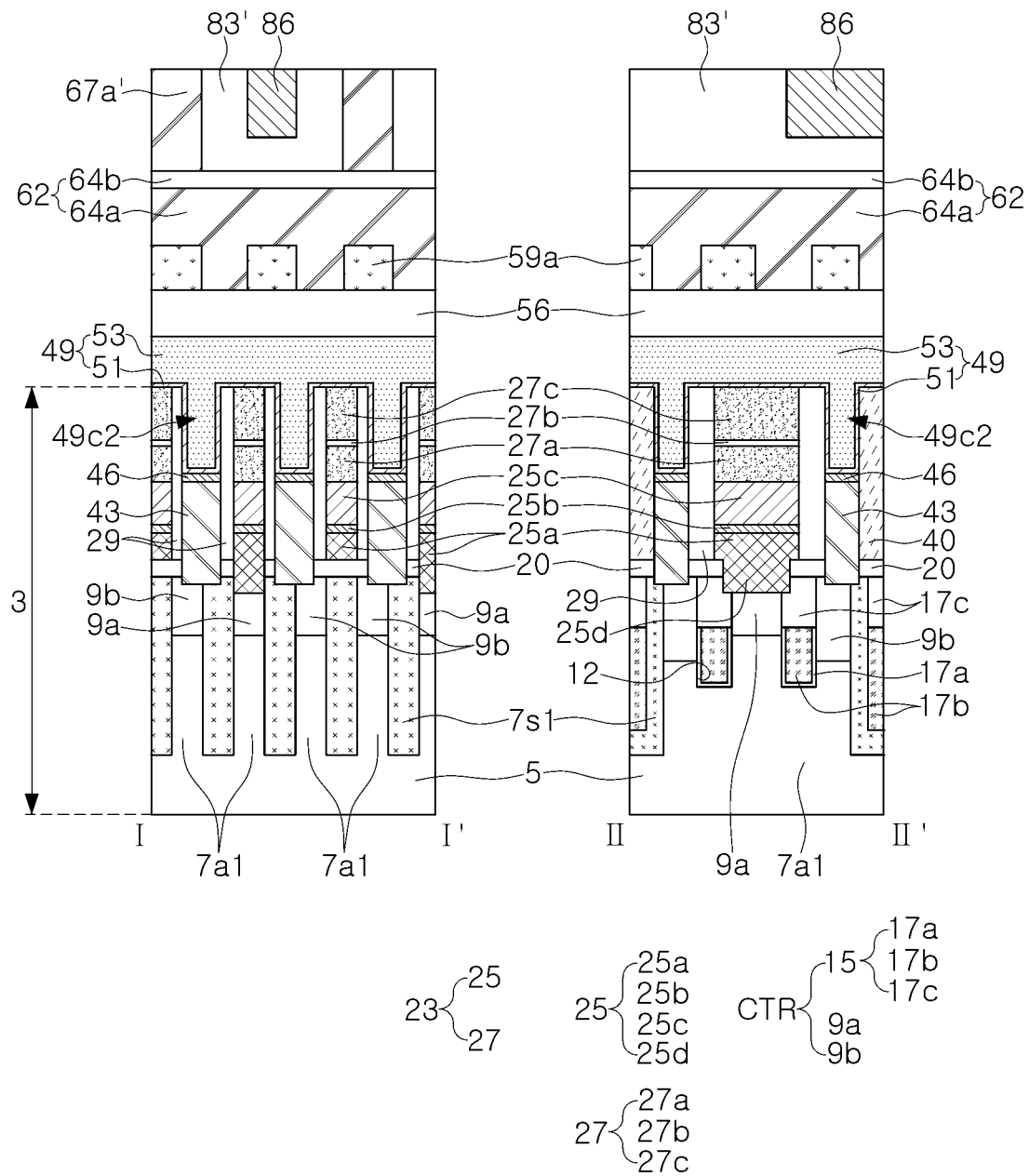
Figure 14B:
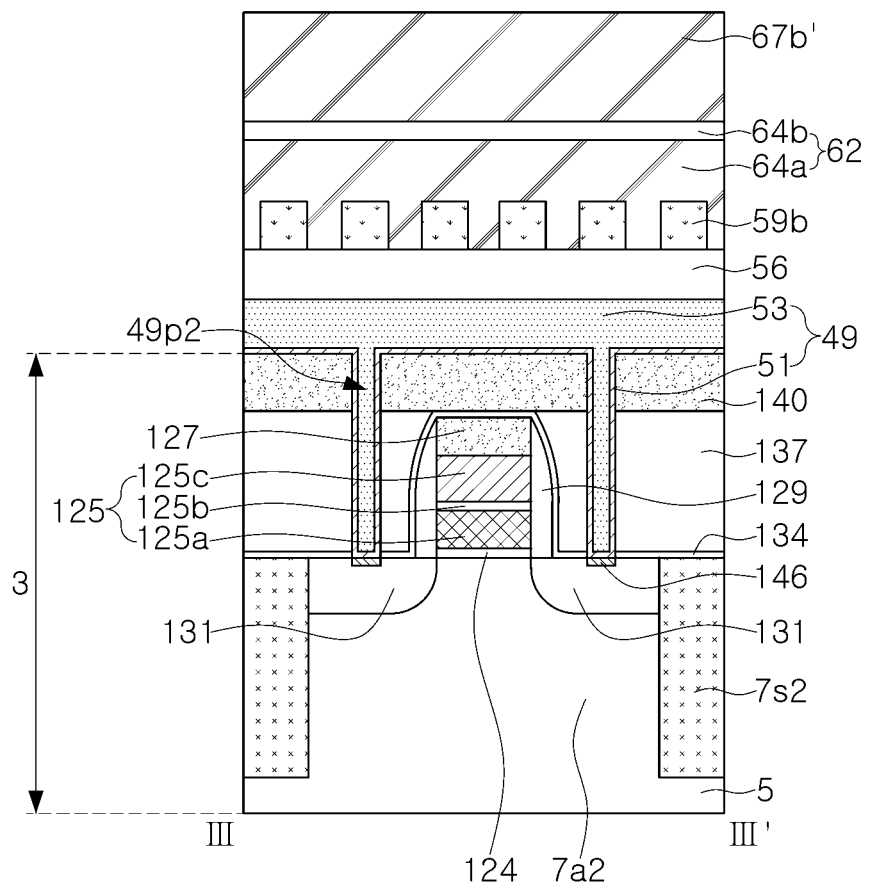

Referring to FIGS. 1A, 14A, and 14B, gap fill patterns 86 may be formed on the second liner layer (83 in FIG. 13A) positioned between the first upper patterns (67*a* in FIG. 13A). Lower and side surfaces of each of the gap fill patterns 86 may contact the second liner layer (83 in FIG. 13A).

By performing a planarization process, a portion of the second liner layer (83 in FIGS. 13A and 13B) disposed on upper surfaces of the first upper patterns (67*a* in FIG. 13A) and the upper protective layer 67*b* may be removed, and in addition, the thickness of the first upper patterns (67*a* in FIG. 13A) and the thickness of the upper protective layer 67*b* may be reduced. In an example, the planarization process may include an etch back process. Accordingly, a first upper patterns 67*a*' having a reduced thickness, an upper protective layer 67*b*' having a reduced thickness, and a second liner layer 93' having a reduced thickness may be formed.

Figure 15:
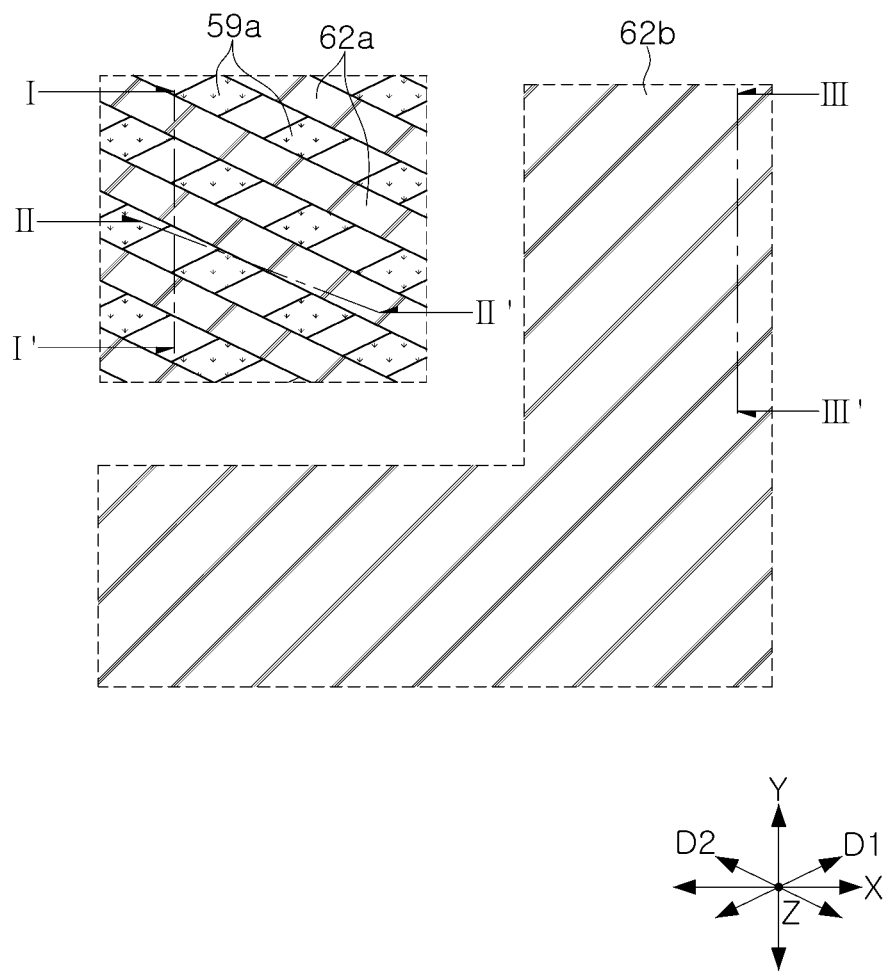
Figure 16:
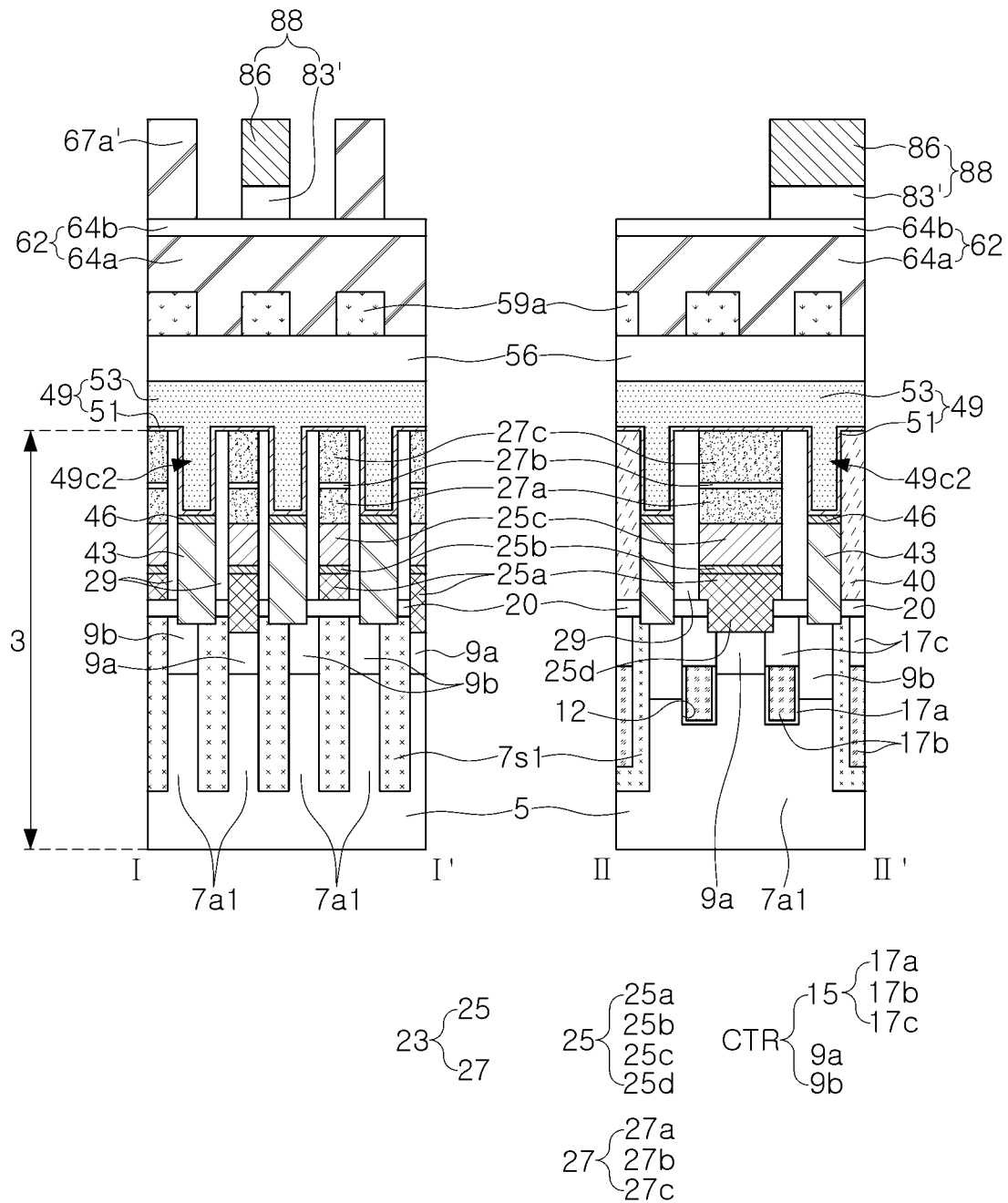
Figure 17A:
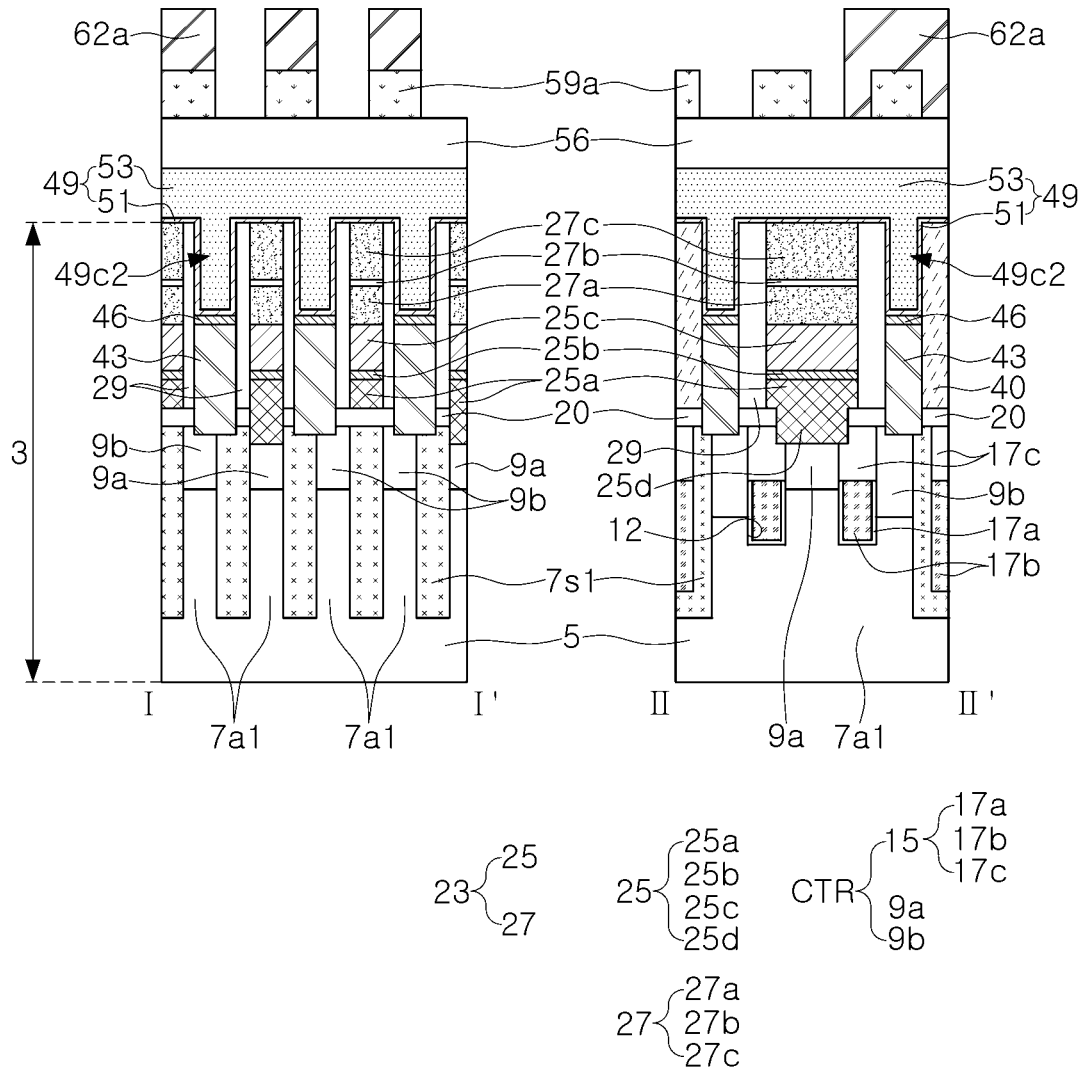
Figure 17B:
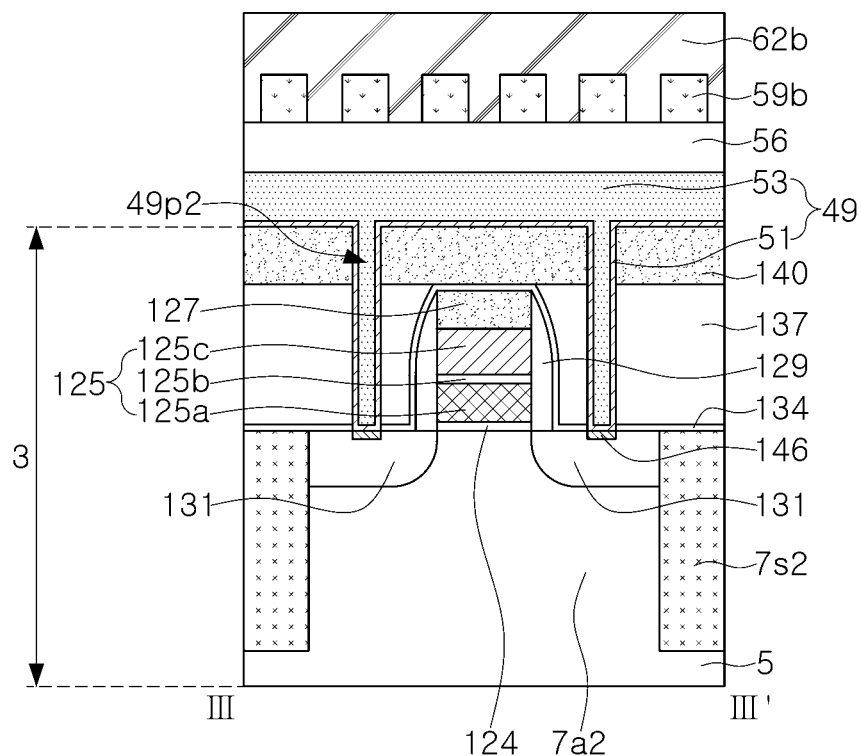

Referring to FIGS. 1A, 15, and 16, to form second liner patterns 83' remaining below the gap fill patterns 86, the second liner layer (83' in FIG. 14A) having a reduced thickness may be anisotropically etched. The second liner patterns 83' and the gap fill patterns 86 sequentially stacked may be defined as second upper patterns 88.

The second upper patterns 88 and the first upper patterns 67*a*' may have parallel line shapes. The first upper patterns 67*a*' may be repeatedly arranged alternately with the second upper patterns 88.

Referring to FIGS. 1A, 5B, 15, 17A, and 17B, to form second preliminary pad mask patterns 62*a* and a wiring mask protective layer 62*b*, the second mask layer (62 in FIGS. 16 and 14B) may be etched by an etching process in which the first upper patterns (67*a*' in FIG. 16), the second upper patterns (88 of FIG. 16), and the upper protective layer (67*b*' of FIG. 14B) are used as an etching mask. While etching the second mask layer (62 in FIGS. 16 and 14B), the first upper patterns (67*a*' in FIG. 16), the second upper patterns (88 in FIG. 16), and the upper protective layer (67*b*' in FIG. 14B) may be removed by etching.

In example embodiments, the second preliminary pad mask patterns 62*a* and the wiring mask protective layer 62*b* may be formed using a multi-patterning technique including a second patterning process (see S55 in FIG. 5B). In example embodiments, the second patterning process uses a second photolithography process, in which DUV light having a wavelength longer than that of the EUV light described with reference to FIGS. 11A and 11B is used as a light source, thereby patterning the capping mask layer (72 in FIGS. 10A and 10B).

In example embodiments, the multi-patterning technique may include performing a patterning process that includes performing a second photolithography process using the DUV light as a light source at least once. In example embodiments, the multi-patterning technique may include performing a patterning process once or at least twice, the patterning process including performing a deposition process and an etching process without a photolithography process.

Figure 10A:
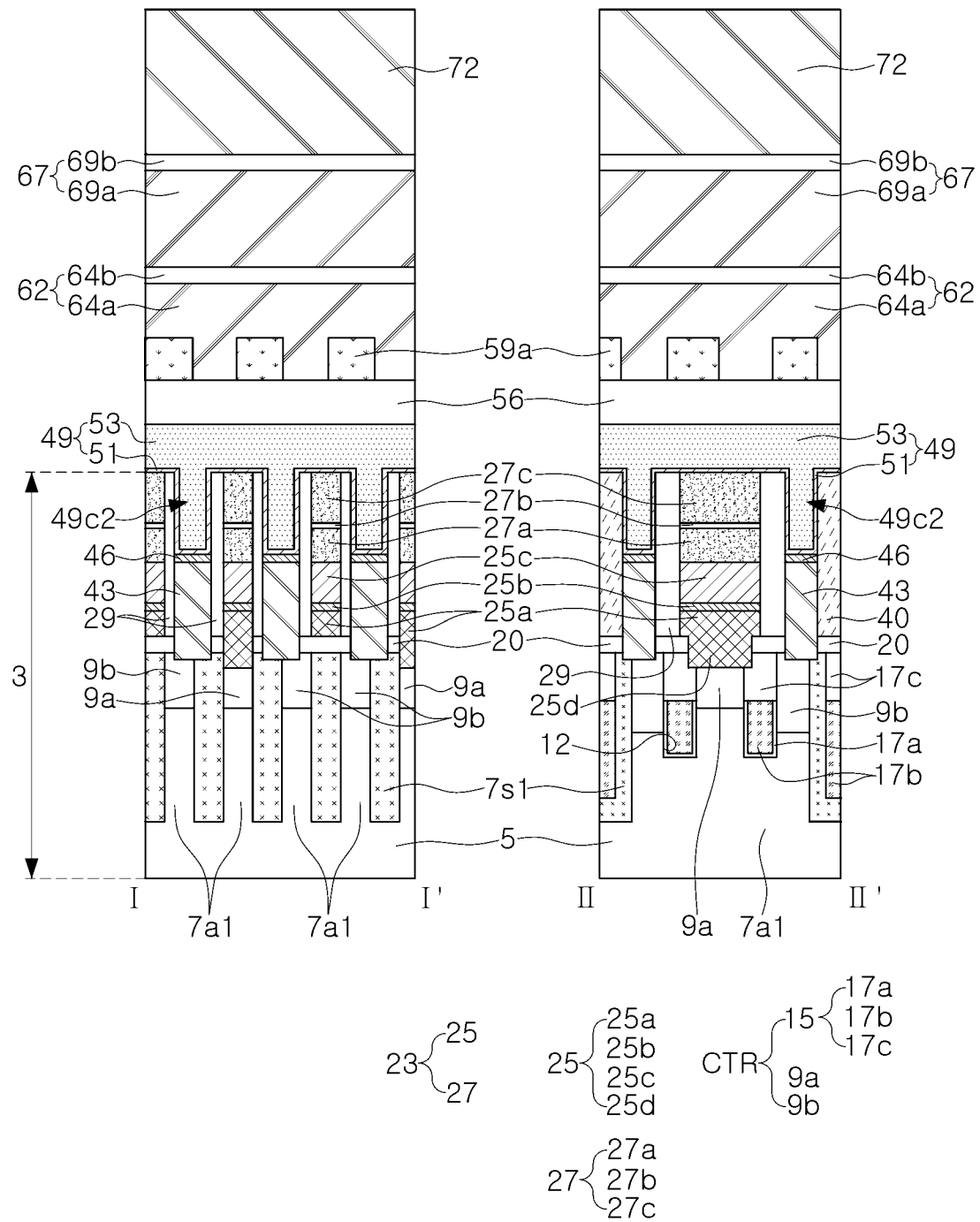
Figure 10B:
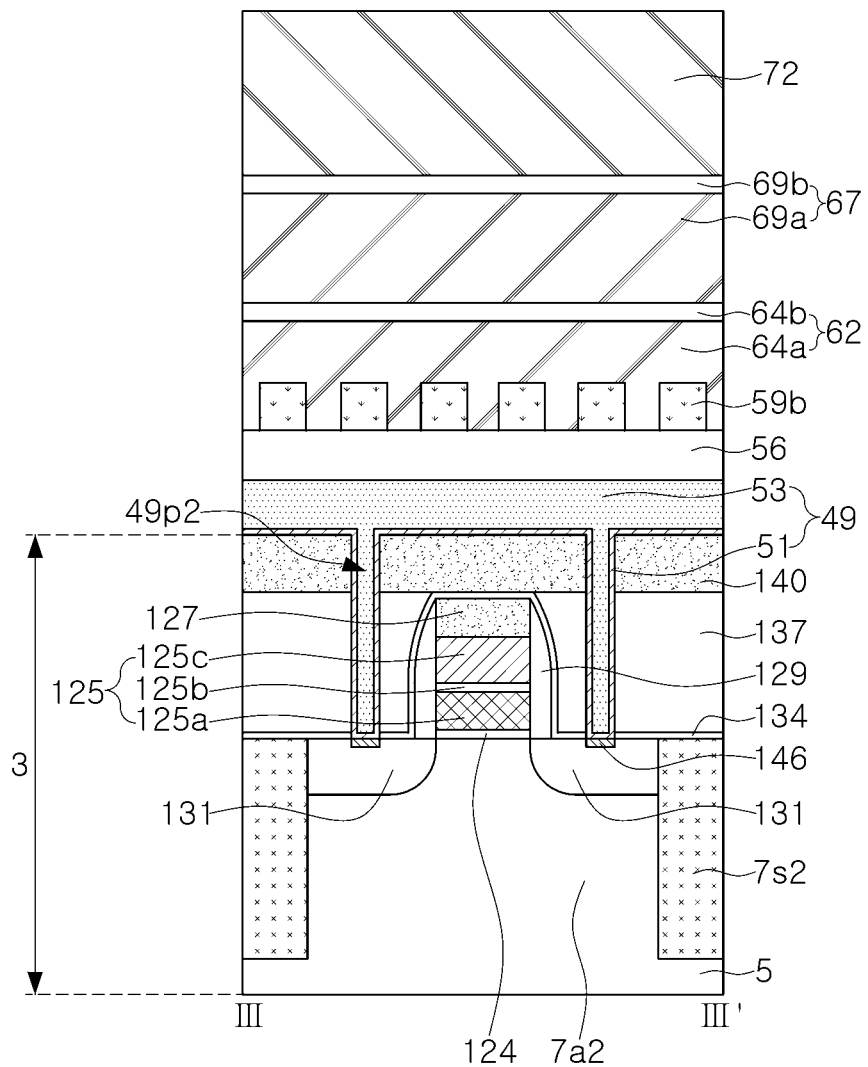

For example, in the multi-patterning technique, a single patterning process including a deposition process and an etching process may include a deposition process for forming the capping mask layer (72 in FIGS. 10A and 10B) as described in FIGS. 10A and 10B, and an etching process of etching the capping mask layer (72 in FIGS. 10A and 10B) to form the capping mask patterns 72*a* and the protective mask pattern 72*b* as in FIGS. 9A, 9B, 11A, and 11B.

In the multi-patterning technique, a single patterning process including a deposition process and an etching process without a photo process may include a deposition process for forming the first liner layer (77 in FIGS. 11A and 11B) as described in FIGS. 11A and 11B, and an etching process of etching the first liner layer (77 in FIG. 11A) to form portions of the first liner layer (77 in FIG. 11A) remaining on the side surfaces of the capping mask patterns (72*a* in FIG. 11A) as described in FIGS. 12A and 12B.

In the multi-patterning technique, another patterning process that is performed once and includes a deposition process and an etching process may include a deposition process for forming the second liner layer 83 as described in FIGS. 13A and 13B, and an etching process of etching the second liner layer (83' in FIG. 14A) to form second liner patterns 83' remaining below the gap fill patterns 86 as described with reference to FIG. 16.

Therefore, to form the second preliminary pad mask patterns 62*a* and the wiring mask protective layer 62*b*, the multi-patterning technique that includes performing a patterning process including a deposition process and an etching process once or at least twice may be used, thereby patterning the second mask layer 62. The thickness of each of the second preliminary pad mask patterns 62*a* and the wiring mask protective layer 62*b* may be less than the thickness of the second mask layer (62 in FIGS. 16 and 14B).

At least one of the wiring mask patterns 59*b* may have a shape of a first line extending in the first horizontal direction X, and each of the first preliminary pad mask patterns 59*a* may have a shape of a second line extending in the first diagonal direction D1 forming an acute or obtuse angle with respect to the first horizontal direction X, and each of the second preliminary pad mask patterns 62*a* may have a shape of a third line extending in the second diagonal direction D2 intersecting the first diagonal direction D1. The first horizontal direction D1, the first diagonal direction D1, and the second diagonal direction D2 may be parallel to any one plane of the lower structure 3. One plane of the lower structure 3 may be an upper surface of the semiconductor substrate 5, a lower surface of the semiconductor substrate 5, upper surfaces of the bit lines 25, or an upper surface of the lower structure 3.

Figure 18:
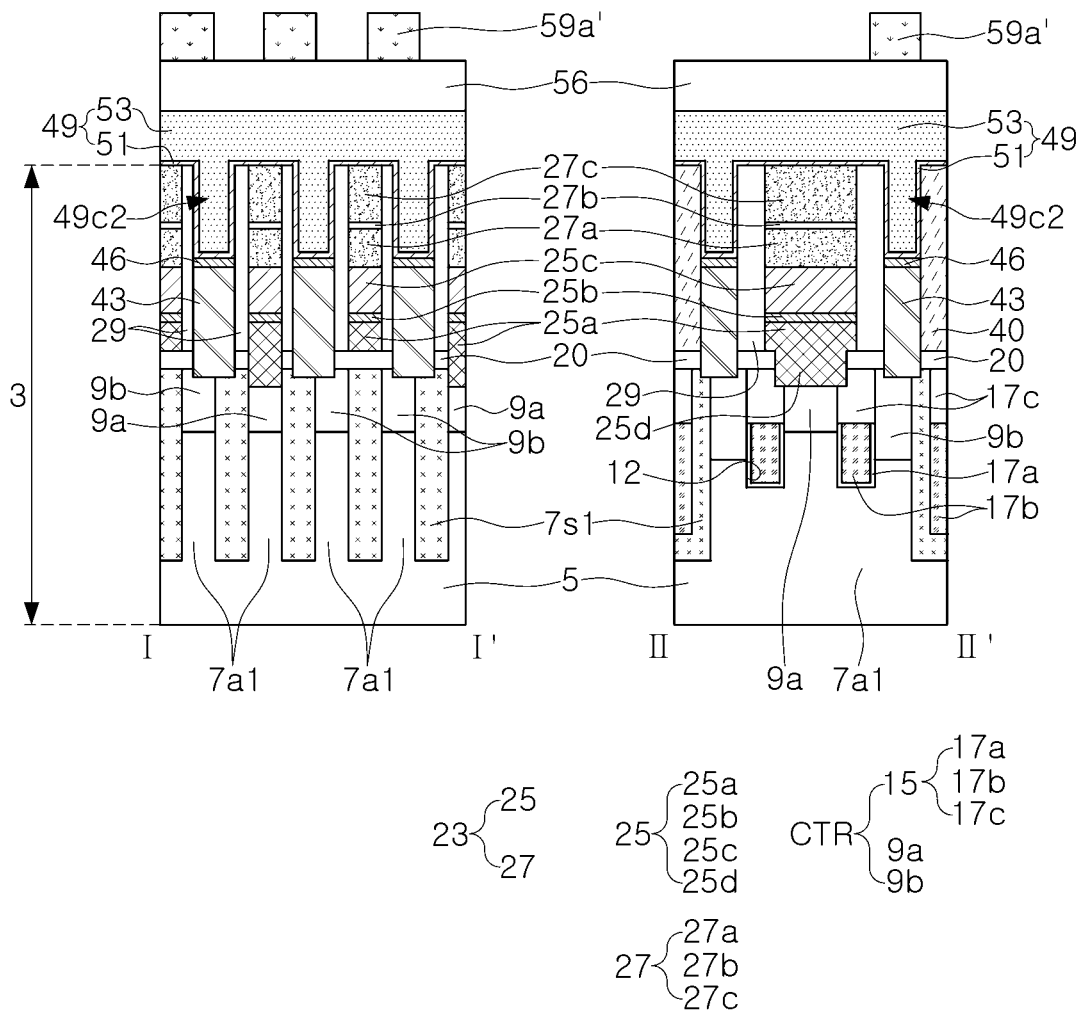

Referring to FIGS. 1A, 5B, and 18, to form pad mask patterns 59*a*' while protecting the wiring mask patterns (59*b* of FIG. 17B), the first preliminary pad mask patterns (62*a* in FIG. 17A) may be etched using an etching process in which the second preliminary pad mask patterns (62*a* in FIG. 17A) and the wiring mask protective layer (62*b* in FIG. 17B) are used as an etching mask (S65 of FIG. 5B). Accordingly, the first preliminary pad mask patterns (62*a* of FIG. 17A) having a line shape may be formed as the pad mask patterns 59*a*' having a dot shape.

Figure 8A:
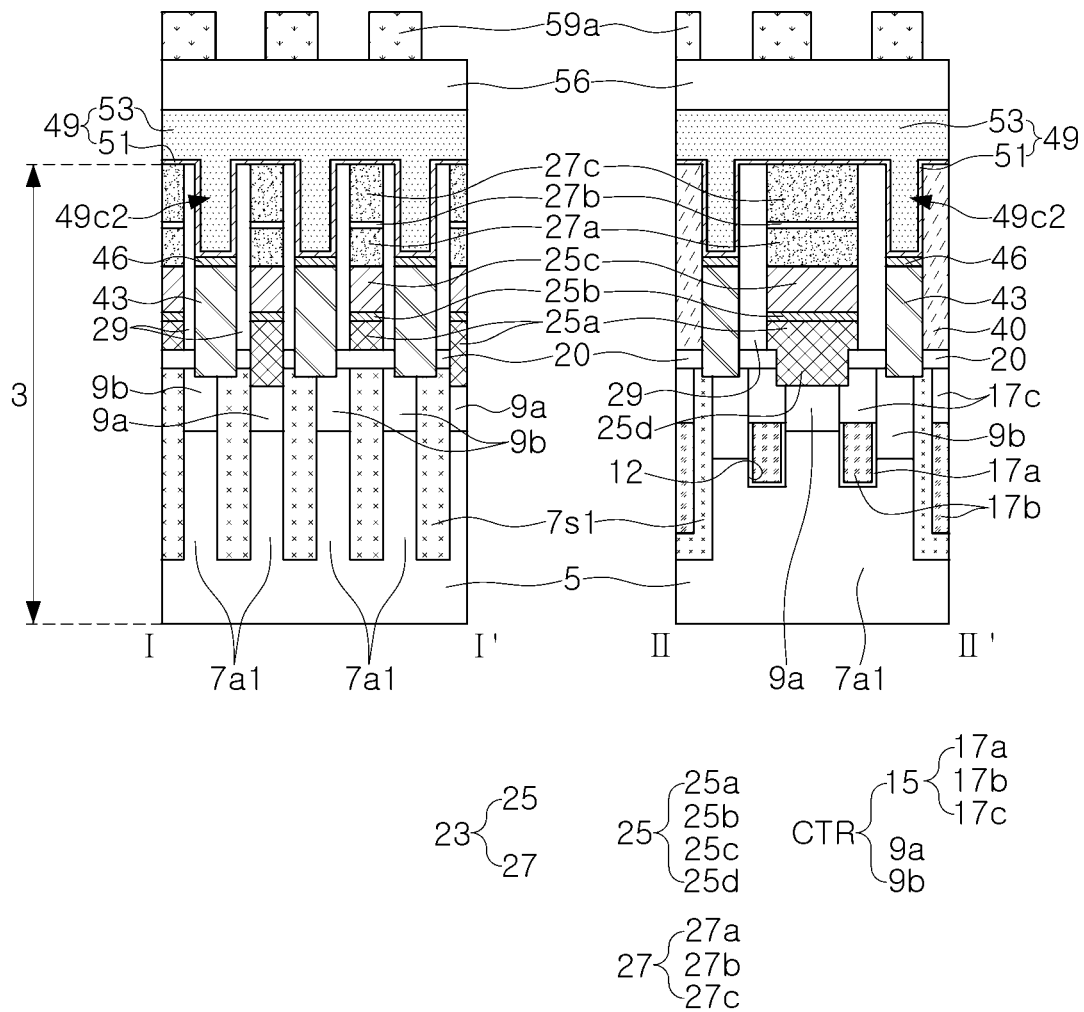
Figure 8B:
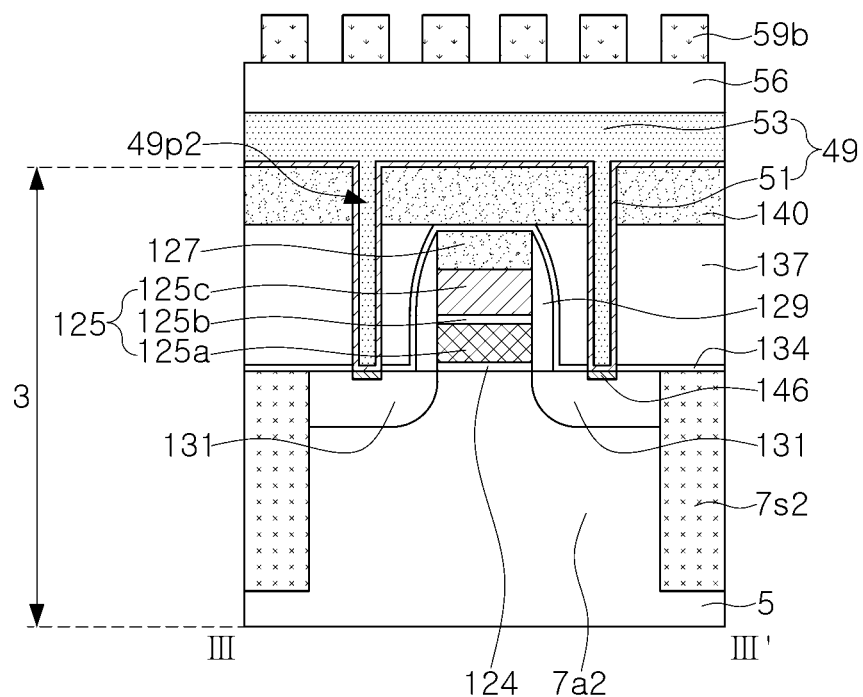
Figure 9A:
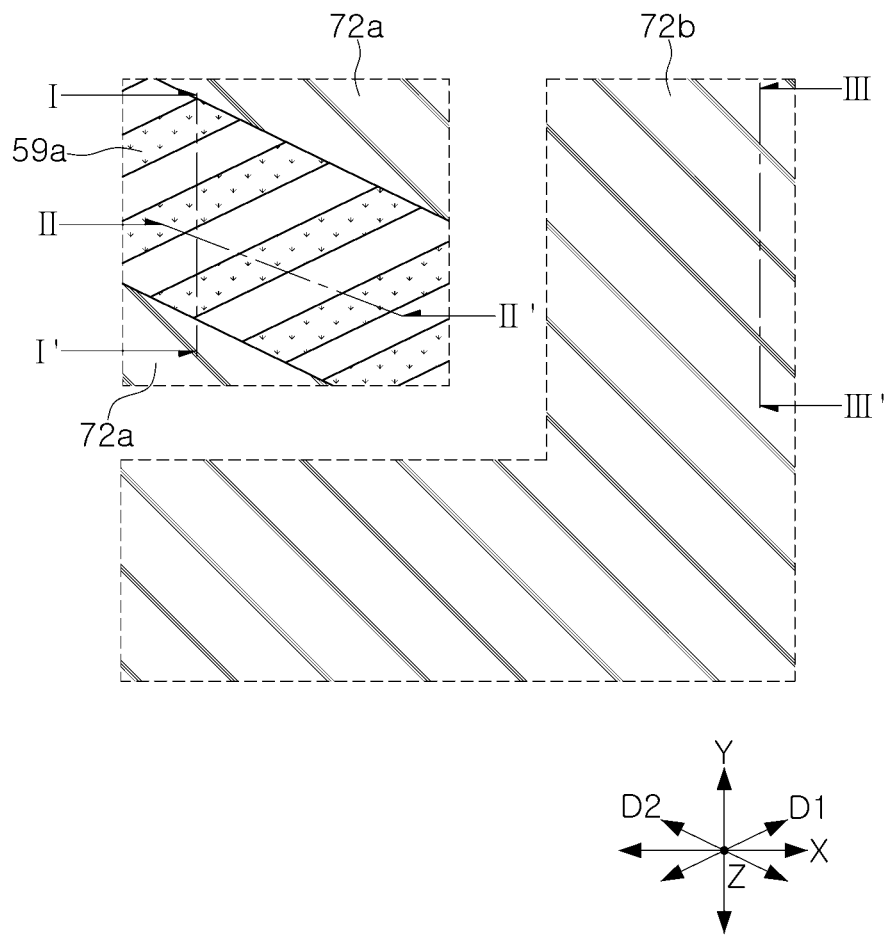
Figure 9B:
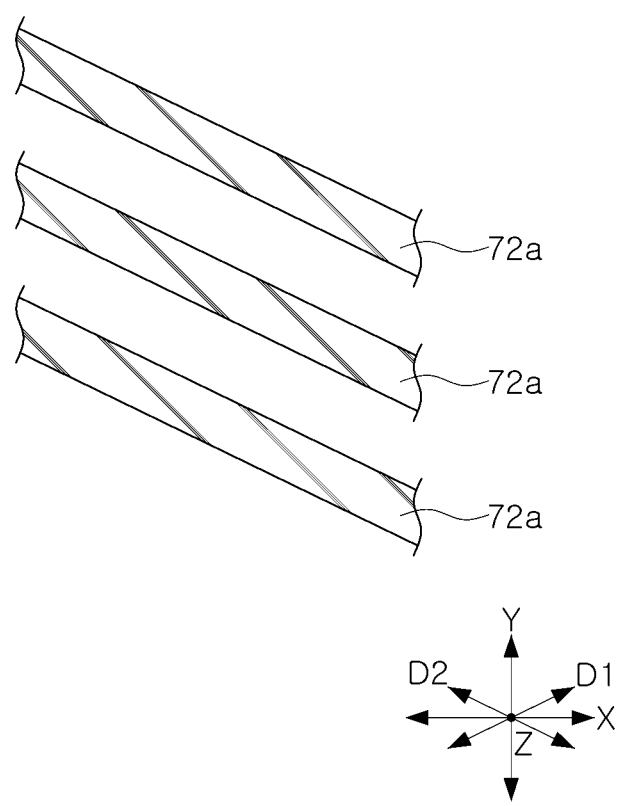

Subsequently, the second preliminary pad mask patterns (62*a* in FIG. 17A) and the wiring mask protective layer (62*b* in FIG. 17B) may be removed. Accordingly, the pad mask patterns 59a' may be formed while protecting the wiring mask patterns (59b of FIG. 8B) as illustrated in FIG. 8B.

Referring to FIGS. 1A, 5B, 19A, and 19B, to form the pad patterns 49c and wiring patterns 49p, the conductive layer 49 may be etched using an etching process in which pad mask patterns 59a' and wiring mask patterns 59b are used as an etching mask (S75 in FIG. 5B). The etching process using the pad mask patterns 59a' and the wiring mask patterns 59b as an etching mask may include sequentially etching the lower layer 56 and the conductive layer 49.

In example embodiments, after the etching process using the pad mask patterns 59a' and the wiring mask patterns 59b as an etching mask is performed or during the etching process in which the pad mask patterns 59a' and the wiring mask patterns 59b are used as an etching mask, the pad mask patterns 59a' and the wiring mask patterns 59b may be removed.

For example, the lower layer 56 may be etched using the pad mask patterns 59a' and the wiring mask patterns 59b as an etching mask, such that lower pad mask patterns 56a remaining below the pad mask patterns 59a' and lower wiring mask patterns 56b remaining below the wiring mask patterns 59b are formed, and the conductive layer 49 may be exposed. Subsequently, the exposed conductive layer 49 may be etched to form pad patterns 49c remaining below the lower pad mask patterns 56a and wiring patterns 49p remaining below the lower wiring mask patterns 56b, and to form grooves 90 extending into the lower structure 3. Accordingly, the pad patterns 49c and the wiring patterns 49p as described with reference to FIGS. 2A and 2B may be formed.

In example embodiments, while the lower layer 56 is etched, the pad mask patterns 59a' and the wiring mask patterns 59b may be etched and removed.

Again, referring to FIGS. 1A, 1B, 2A and 2B, first and second insulating patterns 92a and 92b filling the grooves 90 may be formed. The lower pad mask patterns 56a and the lower wiring mask patterns 56b may be removed while forming the first and second insulating patterns 92a and 92b.

An etch stop insulating layer 94 may be formed on the pad patterns 49c, the wiring patterns 49p, and the first and second insulating patterns 92a and 92b. A data storage structure 97 may be formed on the memory cell area MA. In forming the data storage structure 97, first electrodes 97a may be formed to penetrate through the etch stop insulating layer 94 and be electrically connected to the pad patterns 49c, and a dielectric layer 97b may be formed to conformally cover the first electrodes 97a, and a second electrode 97c may be formed to cover the dielectric layer 97b. The data storage structure 97 may be formed on the pad patterns 49c and the first insulating patterns 92a. An upper insulating layer 99 may be formed on the etch stop insulating layer 94 in the peripheral circuit area PA.

Figure 19A:
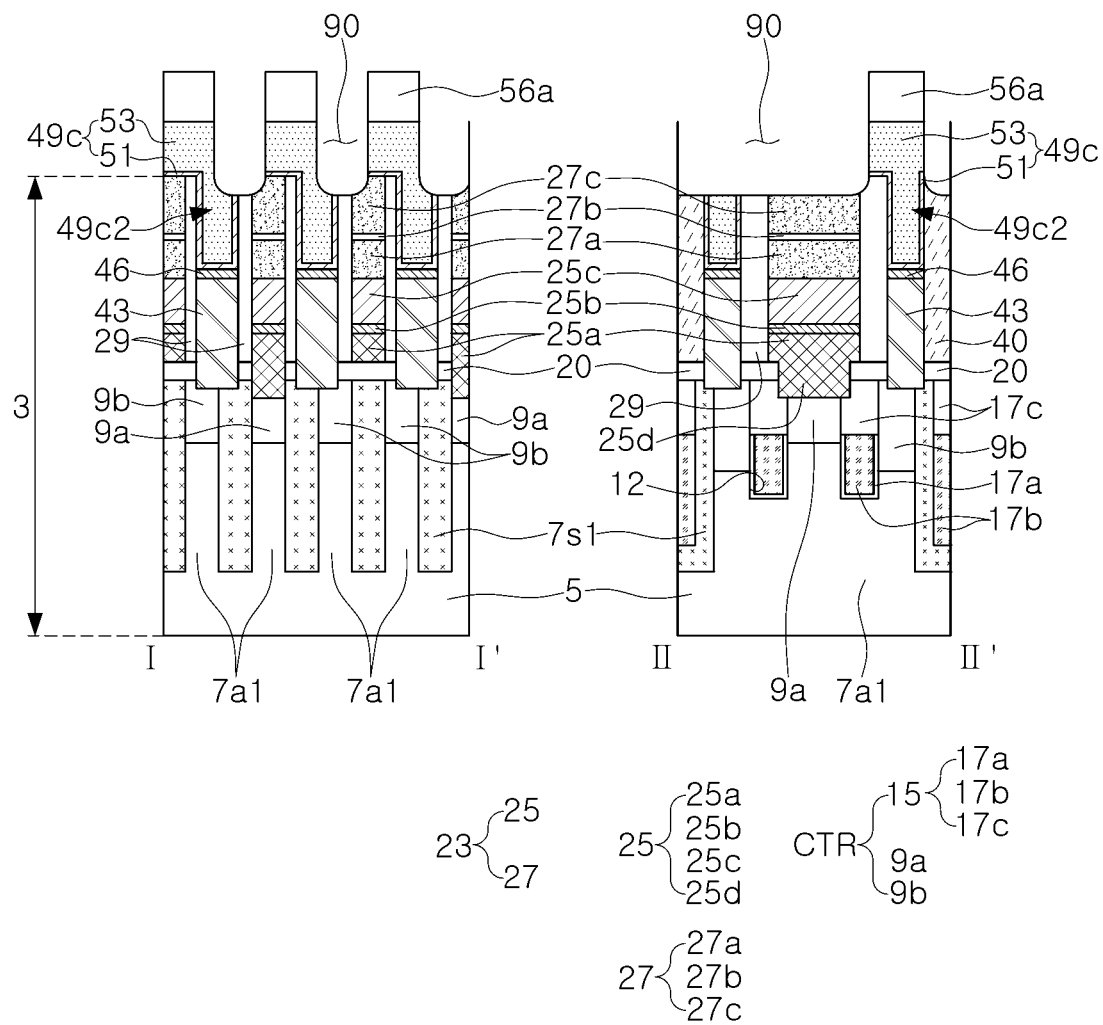
Figure 19B:
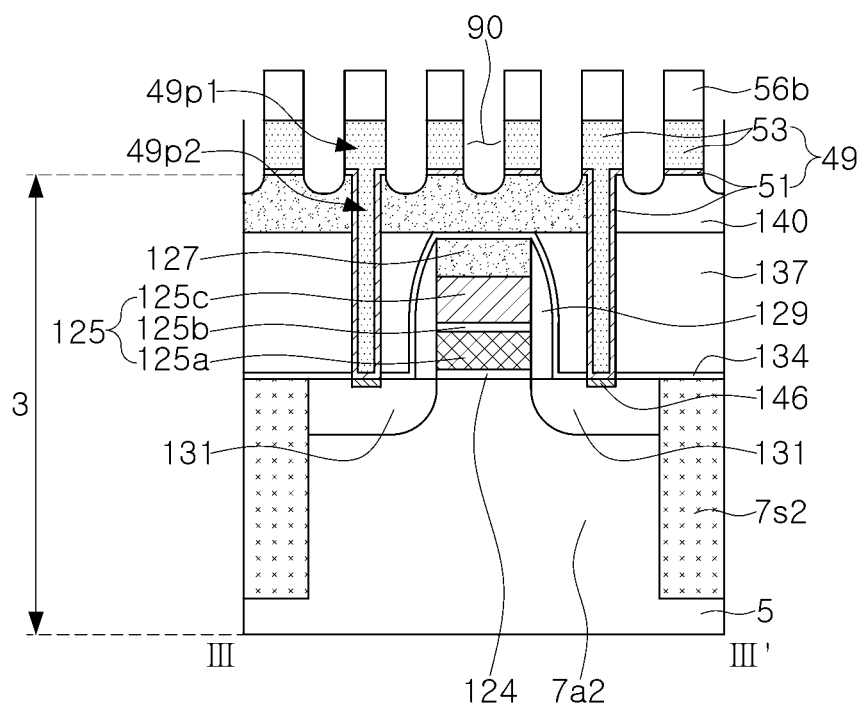

A method of manufacturing a semiconductor device according to the above-described embodiment may include forming a conductive layer (49 in FIGS. 6A and 6B) on a semiconductor substrate (5 in FIGS. 6A and 6B), and pattering the conductive layer (49 in FIGS. 6A and 6B) using the method described with reference to FIGS. 6A to 19B to form the pad patterns (49c in FIG. 19A) and the wiring patterns (49p in FIG. 19B). For example, patterning the conductive layer (49 in FIGS. 6A and 6B) may include respectively performing a first patterning process including a first photolithography process in which extreme ultraviolet (EUV) light is used as a light source as described with reference to FIGS. 1A, 5B, 7, 8A and 8B; and performing a second patterning process including a second photolithography process in which deep ultraviolet (DUV) light having a wavelength longer than a wavelength of the extreme ultraviolet (EUV) light, as described with reference to FIGS. 1A, 9A, 9B, 11A, and 11B, is used as a light source. In this case, the second patterning process may be performed after the first patterning process is performed.

By way of summation and review, example embodiments provide a semiconductor device in which integration and reliability may be improved, and a method of manufacturing the same. As set forth above, according to example embodiments, a method of manufacturing a semiconductor device including dot-shaped pad patterns and linear shape wiring patterns formed at the same height level, and a semiconductor device manufactured by the same may be provided.

That is, in example embodiments, dot-shaped pad patterns may be formed using a first photolithography process with EUV light as a light source and a second photolithography process with DUV light (having a wavelength longer than a wavelength of the EUV light) as a light source, and the line-shaped wiring patterns may be formed by the first photolithography process with EUV light as a light source without using the second photolithography process with the DUV light as a light source. In this manner, since the dot-shaped pad patterns and the line-shaped wiring patterns formed at the same height level may be formed stably and reliably, a semiconductor device having improved integration and reliability may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A method of manufacturing a semiconductor device, the method comprising:
   forming a lower structure including a plurality of transistors;
   forming a conductive layer on the lower structure;
   forming first preliminary pad mask patterns and wiring mask patterns on the conductive layer;
   forming pad mask patterns by patterning the first preliminary pad mask patterns while protecting the wiring mask patterns;
   etching the conductive layer using the pad mask patterns and the wiring mask patterns as an etching mask to form pad patterns and wiring patterns; and
   removing the pad mask patterns and the wiring mask patterns, after using the pad mask patterns and the wiring mask patterns as an etching mask or while using the pad mask patterns and the wiring mask patterns as an etching mask.

2. The method as claimed in claim 1, wherein forming the first preliminary pad mask patterns and the wiring mask patterns includes:
   forming a first mask layer on the conductive layer; and
   patterning the first mask layer in a first patterning process using extreme ultraviolet (EUV) light as a light source.

3. The method as claimed in claim 2, wherein forming the pad mask patterns by patterning the first preliminary pad mask patterns while protecting the wiring mask patterns includes:

forming a second mask layer covering the wiring mask patterns and the first preliminary pad mask patterns on the conductive layer;

patterning the second mask layer using a multi-patterning technique, the multi-patterning technique including performing a deposition process and an etching process once or more to form second preliminary pad mask patterns and a wiring mask protective layer; and etching the first preliminary pad mask patterns, using the second preliminary pad mask patterns and the wiring mask protective layer as an etching mask, to form the pad mask patterns while protecting the wiring mask patterns, wherein at least one of the wiring mask patterns has a first line shape extending in a first horizontal direction, wherein each of the first preliminary pad mask patterns has a second line shape extending in a first diagonal direction forming an acute angle or an obtuse angle with respect to the first horizontal direction, wherein each of the second preliminary pad mask patterns has a third line shape extending in a second diagonal direction intersecting the first diagonal direction, and wherein the first horizontal direction, the first diagonal direction, and the second diagonal direction are parallel to a bottom of the lower structure.

4. The method as claimed in claim 3, wherein patterning the second mask layer using the multi-patterning technique includes:

forming an upper layer on the second mask layer;

forming a capping mask layer on the upper layer; and patterning the capping mask layer using a second photolithography process, the second photolithography process including using deep ultraviolet (DUV) light as a light source to form capping mask patterns and a protective mask pattern, the DUV light having a wavelength longer than a wavelength of the EUV light, wherein the protective mask pattern overlaps the wiring mask patterns, wherein each of the capping mask patterns has a fourth line shape extending in the second diagonal direction, wherein a width of each of the capping mask patterns is greater than a width of each of the first preliminary pad mask patterns, and wherein a distance between the capping mask patterns adjacent to each other is greater than a distance between the first preliminary pad mask patterns adjacent to each other.

5. The method as claimed in claim 4, wherein patterning the second mask layer using the multi-patterning technique further includes:

forming a first liner layer covering the capping mask patterns and the protective mask pattern with a uniform thickness on the upper layer;

forming an upper capping layer overlapping the protective mask pattern while exposing a portion of the first liner layer overlapping the first preliminary pad mask patterns, on the first liner layer;

anisotropically etching the exposed first liner layer to form portions of the first liner layer which remain on side surfaces of the capping mask patterns;

removing the upper capping layer and the capping mask patterns;

etching the upper layer using the first liner layer as an etching mask and removing the first liner layer and the protective mask pattern, such that an upper protective layer is formed below the protective mask pattern, to form first upper patterns and the upper protective layer;

forming a second liner layer covering the first upper patterns and the upper protective layer with a uniform thickness, on the second mask layer;

forming gap-fill patterns on the second liner layer positioned between the first upper patterns;

performing a planarization process to remove a portion of the second liner layer disposed on upper surfaces of the first upper patterns and the upper protective layer;

anisotropically etching the second liner layer to form second liner patterns remaining below the gap-fill patterns, the second liner patterns and the gap-fill patterns sequentially stacked being defined as second upper patterns; and etching the second mask layer by using the first upper patterns, the second upper patterns, and the upper protective layer as an etching mask to form the second preliminary pad mask patterns and the wiring mask protective layer.

6. The method as claimed in claim 5, wherein a lower surface and a side surface of each of the gap-fill patterns contact the second liner layer.

7. The method as claimed in claim 5, wherein:

the second upper patterns and the first upper patterns have line shapes parallel to each other, and the first upper patterns are alternately and repeatedly arranged with the second upper patterns.

8. The method as claimed in claim 5, wherein:

during the etching of the second mask layer by using the first upper patterns, the second upper patterns and the upper protective layer as an etching mask, to form the second preliminary pad mask patterns and the wiring mask protective layer, the first upper patterns, the second upper patterns, and the upper protective layer are removed by etching, and the second preliminary pad mask patterns and the wiring mask protective layer have a thickness less than a thickness of the second mask layer.

9. The method as claimed in claim 1, further comprising forming a lower layer on the conductive layer before forming the first preliminary pad mask patterns and the wiring mask patterns, wherein etching the conductive layer using the pad mask patterns and the wiring mask patterns as an etching mask includes:

forming lower pad mask patterns below the pad mask patterns and lower wiring mask patterns below the wiring mask patterns, exposing the conductive layer by etching the lower layer using the pad mask patterns and the wiring mask patterns as an etching mask, and etching the exposed conductive layer to form the pad patterns remaining below the lower pad mask patterns and the wiring patterns remaining below the lower wiring mask patterns.

10. The method as claimed in claim 9, wherein the pad mask patterns and the wiring mask patterns are removed while the lower layer is etched, the method further comprising removing the lower pad mask patterns and the lower wiring mask patterns after forming the pad patterns and the wiring patterns.

11. The method as claimed in claim 1, further comprising:
forming first insulating patterns filling between the pad patterns and second insulating patterns filling between the wiring patterns; and
forming a data storage structure on the pad patterns and the first insulating patterns.

12. The method as claimed in claim 11, wherein the first insulating patterns and the second insulating patterns extend into the lower structure.

13. The method as claimed in claim 11, wherein the data storage structure includes first electrodes electrically connected to the pad patterns, on the pad patterns, a second electrode covering the first electrodes, and a dielectric layer disposed between the first electrodes and the second electrode.

14. The method as claimed in claim 1, wherein:
the lower structure further includes a semiconductor substrate having a memory cell area and a peripheral circuit area adjacent to the memory cell area,
the plurality of transistors includes cell transistors formed on the semiconductor substrate in the memory cell area, and a peripheral transistor formed on the semiconductor substrate in the peripheral circuit area,
the pad patterns are electrically connected to the cell transistors, and
at least some of the wiring patterns are electrically connected to the peripheral transistor.

15. The method as claimed in claim 14, wherein:
the lower structure further includes bit lines and contact plugs,
each of the cell transistors includes:
a cell gate electrode formed in a cell gate trench crossing a cell active region,
a cell gate dielectric formed between the cell gate electrode and the cell active region, and
a first impurity region and a second impurity region formed in the cell active region on both sides of the cell gate electrode,
each of the bit lines is electrically connected to the first impurity region of each of the cell transistors, and
each of the contact plugs is electrically connected to the second impurity region of each of the cell transistors.

16. The method as claimed in claim 14, wherein:
the lower structure further includes bit lines,
each of the cell transistors includes:
a lower source/drain region, a channel layer, and an upper source/drain region sequentially disposed in a vertical direction,
a cell gate electrode on a side surface of the channel layer, and
a cell gate dielectric between the cell gate electrode and the channel layer, and
the pad patterns are electrically connected to the upper source/drain regions of the cell transistors.

17. A method of manufacturing a semiconductor device, the method comprising:
forming a lower structure including first transistors and second transistors;
forming a conductive layer on the lower structure;
forming a first mask layer on the conductive layer;
patterning the first mask layer by using a first photolithography process to form first preliminary pad mask patterns and wiring mask patterns, the first photolithography process includes using extreme ultraviolet (EUV) light as a first light source;
forming second preliminary pad mask patterns and a wiring mask protective layer using a multi-patterning technique;
etching the first preliminary pad mask patterns, using the second preliminary pad mask patterns and the wiring mask protective layer as an etching mask, to form pad mask patterns while protecting the wiring mask patterns; and
etching the conductive layer using the pad mask patterns and the wiring mask patterns as an etching mask, to form pad patterns and wiring patterns,
wherein the pad patterns are electrically connected to the first transistors,
wherein at least some of the wiring patterns are electrically connected to the second transistors,
wherein the multi-patterning technique includes performing, at least once, a second photolithography process using deep ultraviolet (DUV) light, having a wavelength longer than a wavelength of the EUV light, as a second light source, and
wherein the multi-patterning technique further includes performing a patterning process once or a plurality of times, the patterning process including performing a deposition process and an etching process without a photolithography process.

18. A method of manufacturing a semiconductor device, the method comprising:
forming a conductive layer on a semiconductor substrate; and
patterning the conductive layer to form pad patterns and wiring patterns,
wherein patterning the conductive layer includes:
performing a first patterning process including a first photolithography process using extreme ultraviolet (EUV) light as a first light source, and
performing a second patterning process including a second photolithography process using deep ultraviolet (DUV) light, having a wavelength longer than a wavelength of the EUV light, as a second light source,
wherein the second patterning process is performed after the first patterning process is performed,
wherein the pad patterns are formed after performing both the first patterning process and the second patterning process, and
wherein the wiring patterns are formed by the first patterning process before performing the second patterning process.

19. The method as claimed in claim 18, further comprising forming a data storage structure electrically connected to the pad patterns on the pad patterns, such that the data storage structure stores information on a volatile memory device or on a nonvolatile memory device.

* * * * *